United States Patent
Kondo et al.

(10) Patent No.: US 7,098,740 B2
(45) Date of Patent: Aug. 29, 2006

(54) RADIO FREQUENCY POWER AMPLIFIER AND COMMUNICATION SYSTEM

(75) Inventors: Masao Kondo, Higashimurayama (JP); Toru Masuda, Kodaira (JP); Katsuyoshi Washio, Tokorozawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/688,976

(22) Filed: Oct. 21, 2003

(65) Prior Publication Data

US 2004/0113699 A1    Jun. 17, 2004

(30) Foreign Application Priority Data

Dec. 12, 2002    (JP) .............. 2002-360810

(51) Int. Cl.
*H03F 3/68* (2006.01)
(52) U.S. Cl. ..................... 330/295; 330/288
(58) Field of Classification Search ............... 330/295, 330/288, 124 R, 296, 285; 323/315, 316
See application file for complete search history.

(56) References Cited

U.S. PATENT DOCUMENTS

| | | | |
|---|---|---|---|
| 3,274,505 A * | 9/1966 | Frisch et al. | 330/296 |
| 3,501,710 A * | 3/1970 | Valdis et al. | 330/296 |
| 3,753,121 A * | 8/1973 | Hilbert | 455/341 |
| 5,629,648 A | 5/1997 | Pratt | |
| 6,359,516 B1 * | 3/2002 | Luo et al. | 330/296 |
| 6,727,761 B1 * | 4/2004 | Apel | 330/295 |
| 6,750,721 B1 * | 6/2004 | Patterson | 330/295 |
| 6,822,517 B1 * | 11/2004 | Matsumoto et al. | 330/295 |

* cited by examiner

*Primary Examiner*—Henry Choe
(74) *Attorney, Agent, or Firm*—Reed Smith LLP; Stanley P. Fisher, Esq.; Juan Carlos A. Marquez, Esq.

(57) ABSTRACT

There is provided not only a radio frequency power amplifier using an SiGe HBT subject to a little amplification distortion, but also a communication system using the same. A conventional radio frequency power amplifier provides base bias paths of transistors $Q_1$ through $Q_N$ (SiGe HBT) with bias resistors $R_{11}$ through $R_{1N}$ having resistance values three to five times higher than those of a ballast resistor attached to each transistor's base. A coil $L_B$ is provided in parallel with the bias resistor as a means for compensating a voltage drop due to direct current component $I_{DC}$ flowing through the bias resistor. Addition of the bias resistor suppresses non-linearity of low-frequency variations in an output current. Addition of the coil compensates for voltage drop. Accordingly, the maximum linear output power can be improved. As a result, it is possible to provide the power amplifier subject to a little amplification distortion within a wide output range.

6 Claims, 12 Drawing Sheets

RADIO FREQUENCY POWER AMPLIFIER AND COMMUNICATION SYSTEM

FIELD OF THE INVENTION

The present invention relates to a radio frequency power amplifier and a wireless communication terminal such as a cellular phone and the like using the same.

BACKGROUND OF THE INVENTION

Conventionally, a configuration in FIG. 2 is widely known as such type of radio frequency power amplifier (see patent document 1). There is used a plurality of GaAs Hetero-junction Bipolar Transistors ($Q_1$ through $Q_N$) as high-frequency amplifying transistors. The hetero-junction bipolar transistor is hereinafter referred to as HBT or simply as a transistor.

As shown in FIG. 2, an emitter of each transistor ($Q_1$ through $Q_N$) is grounded. A base connects with a high-frequency input terminal via a capacitor ($C_1$ through $C_N$). A collector connects with a high-frequency output terminal. The base of each transistor is connected to a base bias circuit via a resistor ($R_1$ through $R_N$). The base bias circuit comprises an HBT ($Q_{B1}$) and a resistor $R_{B1}$. An emitter of the transistor $Q_{B1}$ is grounded. A base and a collector are connected to each other. These are connected to constant voltage supply $V_{CC}$ via the resistor $R_{B1}$.

According to the prior art (patent document 1), a high-frequency signal supplied to an input terminal $RF_{in}$ enters each base of the HBT ($Q_1$ through $Q_N$) via capacitors $C_1$ through $C_N$, is amplified in each HBT, and exits from a collector of each HBT to an output terminal RFout. The bias circuit supplies a specified voltage. The resistors $R_1$ through $R_N$ function as ballast resistors. When a large proportion of current starts flowing through a specific HBT, a large amount of current flows to a ballast resistor connected to that HBT to cause a voltage drop. The base vogltage for that HBT drops to solve the unbalanced current flow.

[Patent document 1]
  U.S. Pat. No. 5,629,648

SUMMARY OF THE INVENTION

Let us consider a case where the above-mentioned high-frequency power amplifier according to the prior art employs an SiGe HBT instead of a GaAs HBT as the amplifying transistor. The SiGe HBT contains a base comprising SiGe mix crystal and an emitter and a collector comprising Si. In such case, the following advantages and problems occur due to a difference between GaAs HBT and SiGe HBT characteristics.

The SiGe HBT reduces an emitter resistance per emitter area to 1/40 to 1/20 of that for the GaAs HBT. Accordingly, the SiGe HBT has advantages of decreasing a loss in the emitter resistor and improving the efficiency during a power amplification operation. However, there is a side effect of increasing signal distortion due to the amplification. This is because a small emitter resistance causes remarkable exponential relationship between voltage and current characteristics. Further, the input/output relationship becomes more non-linear.

An increase of the signal distortion greatly influences the non-linearity of low-frequency variation waveforms for the output signal amplitude as will be described below. Normally, the high-frequency power amplifier amplifies a sum of a plurality of signals having adjacent frequencies. The amplitude of the sum signal is subject to variations in a frequency between the adjacent frequencies, i.e., a difference frequency. The difference frequency is much lower than the original frequency. A waveform for signal amplitude variations at the low-frequency is called an envelope waveform. FIG. 3A schematically shows an example of envelope waveform $I_{env}$ for output current $I_{out}$. FIG. 3A also depicts average output current $I_{ave}$ of an amplifying transistor and chronological transition of base voltage $V_b$.

This example shows an output current waveform when the power amplifier amplifies a sum signal of two waves of approximately 2 GHz frequencies with the frequency difference of 5 MHz. A shaded portion in the envelope waveform shows an area at approximately the frequency of 2 GHz. The amplitude of the output current waveform (envelope waveform $I_{env}$) fluctuates at the difference frequency $\Delta f$ of 5 MHz. Since the power amplifier normally operates at the AB class, the bottom of the envelope waveform $I_{env}$ is cut off at 0. As a result, a large difference occurs between maximum and minimum envelope waveforms.

If the voltage-current characteristics of a transistor include non-linearity like an exponential tendency, the envelope waveform is distorted. The distorted envelope waveform also distorts the original high-frequency signal waveform, causing an interference between two adjacent waves. As mentioned above, the non-linearity of the voltage-current characteristics tends to increase according as the emitter resistance decreases.

It is therefore an object of the present invention to provide a radio frequency power amplifier and a communication system using the same capable of using an SiGe HBT as the amplifying transistor, making use of the above-mentioned advantages, and decreasing the side effect of increasing distortion.

To solve the above-mentioned problems of the power amplifier using the SiGe HBT, the radio frequency power amplifier according to the present invention basically uses a combination of the following two means.

The first means arranges a resistor having a value three to five times greater than that of a conventional ballast resistor for the GaAs HBT at the same position as the ballast resistor in FIG. 2 showing the circuit diagram of the prior art or between the ballast resistor and a base bias power supply (hereafter referred to as a base bias circuit). In the following description, this resistor is referred to as the bias resistor for a distinction from the ballast resistor.

The second means provides the base bias circuit with a function that compensates for a base voltage drop in the amplifying transistor (SiGe HBT) due to a voltage drop in the bias resistor.

Operations of the above-mentioned two means will be described below. The following first describes operations of the first means, i.e., inserting the bias resistor. FIG. 3B diagrams output current Iout with the bias resistor inserted by representing envelope waveform $I_{env}$, average output current $I_{ave}$ for the amplifying transistor, and the chronological transition of base voltage $V_b$. The base bias circuit is configured to be high impedance against a high-frequency signal. Little high-frequency signal flows through the bias resistor.

Accordingly, the bias resistor causes no loss in a high-frequency signal, maintaining the advantage of high efficiency compared to the use of the GaAs HBT for the amplifying transistor.

FIG. 3B shows AB-class operations for the power amplifier. In this case, the average output current $I_{ave}$ of the amplifying bipolar transistor, i.e., an average of collector currents fluctuates at a low frequency like the fluctuation of the envelope waveform $I_{env}$. For this reason, when a current flows from the bias circuit to bases of the amplifying bipolar transistors $Q_1$ through $Q_N$ via the bias resistor, that current also fluctuates at a low frequency. Further, a base voltage of the amplifying transistor also fluctuates at a low frequency due to voltage drop $\Delta V_b$ generated by the base current flowing through the bias resistor. This base voltage fluctuation causes a negative feedback. The input/output relationship for the amplifying transistor at low frequencies approximates to be more linear from being exponential. As a result, it is possible to suppress a distortion of the envelope waveform.

However, inserting the bias resistor causes the following side effect. When the power amplifier generates a high output, an average value of output currents increases. This also increases an average value of base currents flowing through the bias resistor. A voltage drop in the bias resistor decreases an average of base voltages for the amplifying bipolar transistor (SiGe HBT) as shown in FIG. 3B, thus decreasing the gain. As a result, non-linearity increases in high outputs, causing a side effect of decreasing the maximum linear output, i.e., the maximum output capable of maintaining the linearity at a specified level or higher.

To improve this side effect, the above-mentioned second means is needed. The second means provides the bias circuit with the function of compensating for a voltage drop due to the bias resistor and making a base voltage average almost equal to the value for the case of using no bias resistor as shown in FIG. 3C. Specific configurations of this function will be described later. This function can prevent the maximum linear output power from decreasing.

The concurrent use of the first and second means allows the power amplifier using the SiGe HBT to provide intended high efficiency and low distortion.

The following describes specific configurations of the second means. Broadly, there are three configurations.

The first configuration just needs to arrange a coil parallel to the bias resistor. The coil's inductance L is set to be large enough to fully remove low-frequency component $f_L$ caused by a low-frequency fluctuation in the above-mentioned envelope waveform out of a base current from the base bias circuit to the base of the amplifying transistor. Consequently, the low-frequency component $f_L$ in the base current flows through the bias resistor. Direct current component $I_{DC}$ flows through the coil. As a result, no voltage drop occurs in direct current components for the bias resistor. This makes it possible to suppress the above-mentioned distortion increase due to a gain decrease in high output, improving the maximum linear output power. Since the low-frequency component $f_L$ flows through the bias resistor as conventionally practiced, it is possible to maintain the effect of suppressing envelope waveform distortion due to a negative feedback.

The second configuration just needs to provide a function of detecting the amount of decrease in the amplifying transistor's base average voltage due to a voltage drop in the bias resistor and automatically increasing an output voltage from the base bias circuit so as to compensate this voltage drop. Specific configuration examples will be described in the third to eighth embodiments with reference to FIGS. 5 through 10.

Alternatively, the third configuration just needs to provide a function of detecting an average output current for the amplifying transistor and automatically increasing an output voltage from the bias circuit for an appropriate value in proportion to the detected value. This is because an average decrease amount of base voltages due to a voltage drop in the bias resistor is proportional to an average output current for the amplifying transistor.

This basic concept is diagramed as a configuration in FIG. 19. An amount proportional to the average output current is detected as follows. There is provided a bipolar transistor $Q_S$ dedicated to average output current detection. In this transistor, an emitter is grounded. A base is connected to a high-frequency input terminal $RF_{in}$ via a capacitor $C_S$ and is connected to a base bias voltage source VBB via a resistor $R_S$. An amount proportional to the average output current is detected based on a voltage drop in a resistor $R_{B2}$ connected to a collector of the transistor $Q_S$.

The first and second means are indispensable for an SiGe HBT used as the amplifying transistor. The third configuration is also effective for improving the maximum linear output when a compound HBT such as GaAs HBT is used as the amplifying transistor. When an output from the amplifying transistor comprising a compound HBT increases to increase an average output current, a voltage drop occurs in the emitter resistor to decrease the gain, increase the non-linearity, and decrease the maximum linear output. To solve this problem, the third configuration can be used to increase an output voltage from the bias circuit so as to compensate for a voltage drop in the emitter resistor.

Specific examples for implementing the third configuration will be described in the ninth to fifteenth embodiments with reference to FIGS. 11 through 17.

The following describes a representative example of combining the first means and the first configuration of the second means. That is to say, a radio frequency power amplifier according to the present invention comprises a bipolar transistor for emitter ground amplification having a base connected to an input terminal and a base bias power supply and having a collector connected to an output terminal. Further, a resistor and a coil are inserted parallel between the base and the base bias power supply.

The following describes a representative example of combining the first means and the second configuration of the second means. A radio frequency power amplifier according to the present invention comprises a bipolar transistor for emitter ground amplification having a base connected to an input terminal and a base bias power supply and having a collector connected to an output terminal. There is provided a function of detecting an average voltage at a base-side node of the resistor and changing output voltage from the base bias power supply in accordance with a detected value.

The following describes a representative example of combining the first means and the third configuration of the second means. A radio frequency power amplifier according to the present invention comprises: a bipolar transistor for emitter ground amplification having a base connected to an input terminal and a base bias power supply and having a collector connected to an output terminal; and a bipolar transistor for average output current detection in which a base is connected to a high-frequency input terminal and the base bias power supply, and a collector is connected to a resistor. Further, there is provided a function of detecting an average output current based on the voltage drop in the resistor and changing output voltage from the base bias power supply in accordance with a detected value.

BRIEF DESCRIPTION OF THE DRAWINGS

FIG. 3 shows a time variation in an output current and a base voltage of a amplifying transistor in order to explain effects of first and second means provided in the present invention;

DETAILED DESCRIPTION OF THE PREFERRED EMBODIMENTS

Embodiments of the present invention will be described in further detail with reference to the accompanying drawings.

Embodiment 1

Figure 1:
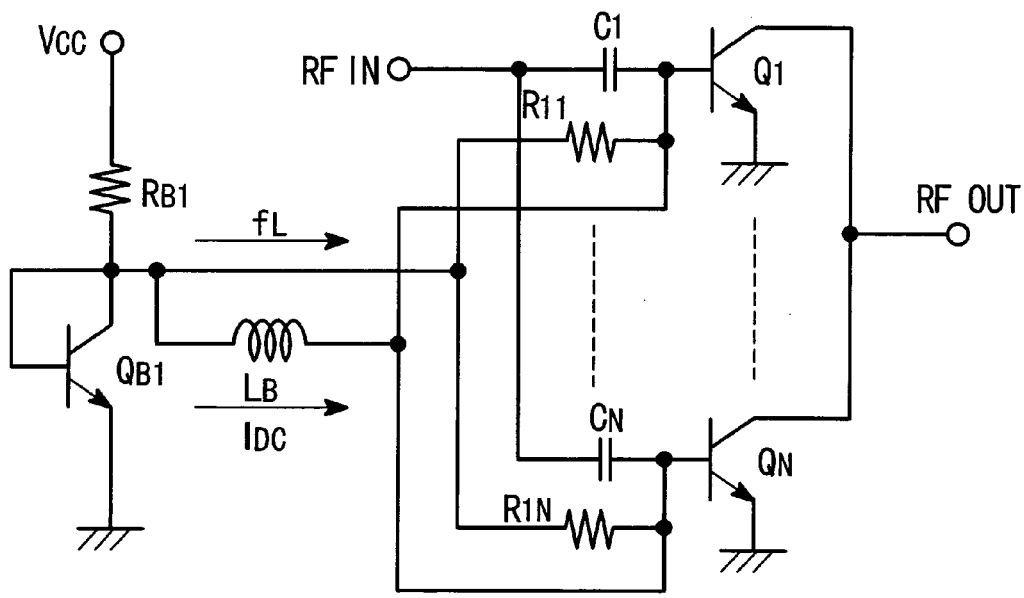
FIG. 1 is a circuit diagram showing a major part of a radio frequency power amplifier according to the first embodiment of the present invention.

FIG. 1 is a circuit diagram showing a major part of a radio frequency power amplifier compliant with WCDMA (Wideband Code Division Multiple Access) indicative of the first embodiment of the present invention. The diagram includes an amplifying transistor and a bias circuit connected to its base.

The embodiment exemplifies a combination of the fist means and the first configuration of the second means. This example shows arrangement of a coil parallel to a bias resistor having a value three to five times greater than that of a conventional ballast resistor.

In FIG. 1, the reference symbols $Q_1$ to $Q_N$ denote N equivalent SiGe HBTs; $C_1$ to $C_N$ denote N equivalent capacitors; $R_{11}$ to $R_{1N}$ denote N equivalent resistors; $Q_{B1}$ denotes an SiGe HBT; $R_{B1}$ denotes a resistor; $L_B$ denotes a coil; $V_{CC}$ denotes a constant voltage supply; $RF_{in}$ denotes a high-frequency input terminal; and $RF_{out}$ denotes a high-frequency output terminal. The term "equivalent" here signifies an attribute of having an equivalent size, characteristic, and value. This applies to the other embodiments to follow.

$Q_1$ to $Q_N$ function as amplifying transistors. $R_{11}$ to $R_{1N}$ function as bias resistors. $Q_{B1}$ and $R_{B1}$ function as a transistor and a resistor of the bias circuit, respectively. Emitters of the transistors $Q_1$ to $Q_N$ are grounded. Collectors are connected to high-frequency output terminal RFout. Wiring from each transistor's base branches into three paths.

One of the paths joins wiring of the other transistors ($Q_1$ through $Q_N$) via one of capacitors $C_1$ through $C_N$ and is connected to the high-frequency input terminal $RF_{in}$. Another path unites with wiring of the other transistors ($Q_1$ through $Q_N$) via one of resistors $R_{11}$ through $R_{1N}$ and is connected to the collector of the transistor $Q_{B1}$. The remaining path joins wiring of the other transistors ($Q_1$ through $Q_N$) and is connected to the collector of the transistor $Q_{B1}$ via the coil $L_B$.

The emitter of the transistor $Q_{B1}$ is grounded. Its base is connected to the collector. The collector is connected to the constant voltage supply $V_{CC}$ via the resistor $R_{B1}$. A circuit component comprising the transistor $Q_{B1}$ and the resistor $R_{B1}$ functions as a constant voltage supply. In this example, the constant voltage supply $V_{CC}$ is set to 3.4 V. The bias resistors $R_{11}$ through $R_{1N}$ are set to 50 Ω in respective parallel connections. The inductance of the coil $L_B$ is set to 10 μH.

Two paths are used for base current of each amplifying transistor. One path connects with the bias resistor. The other connects with the coil parallel thereto. Since the inductance of the coil $L_B$ is set to a value large enough to cut off low-frequency component (approximately 5 MHz) $f_L$, the low-frequency component $f_L$ flows through the bas resistor. Direct current component $I_{DC}$ flows through the coil $L_B$.

Since the low-frequency $f_L$ flows through the bias resistors $R_{11}$ to $R_{1N}$, its negative feedback relieves non-linearity due to the exponential relationship between current and voltage characteristics. The envelope waveform distortion is suppressed. Since the direct current component $I_{DC}$ flows through only the coil $L_B$, the bias resistor is free from a voltage drop due to direct current components. This decreases a distortion that increases due to a gain decrease at high outputs, improving the maximum linear output power.

Embodiment 2

Figure 2:
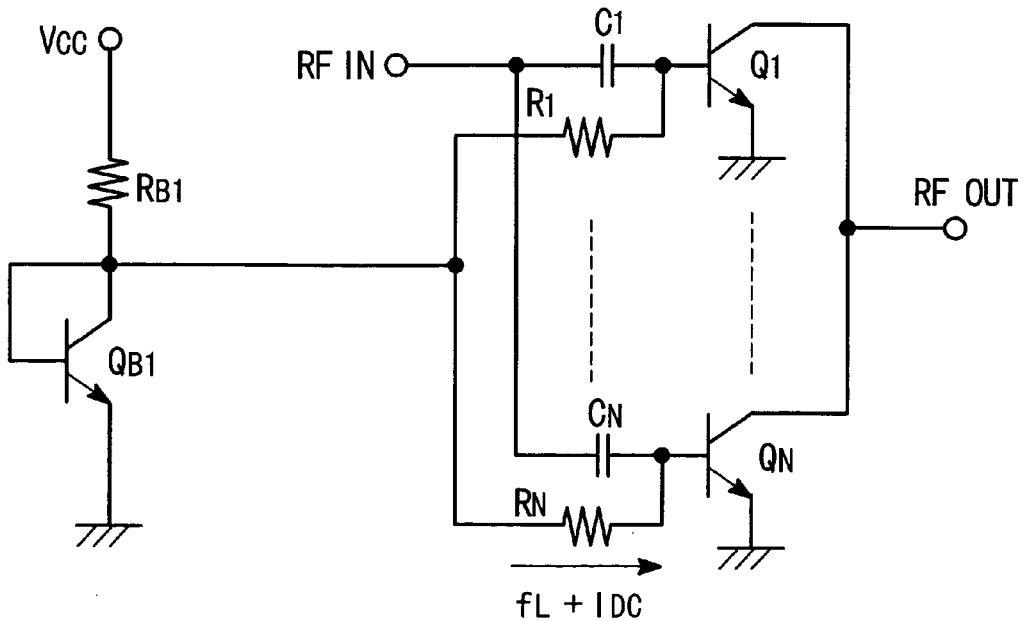
FIG. 2 is a circuit diagram showing a major part of a conventional radio frequency power amplifier.
Figure 3A:
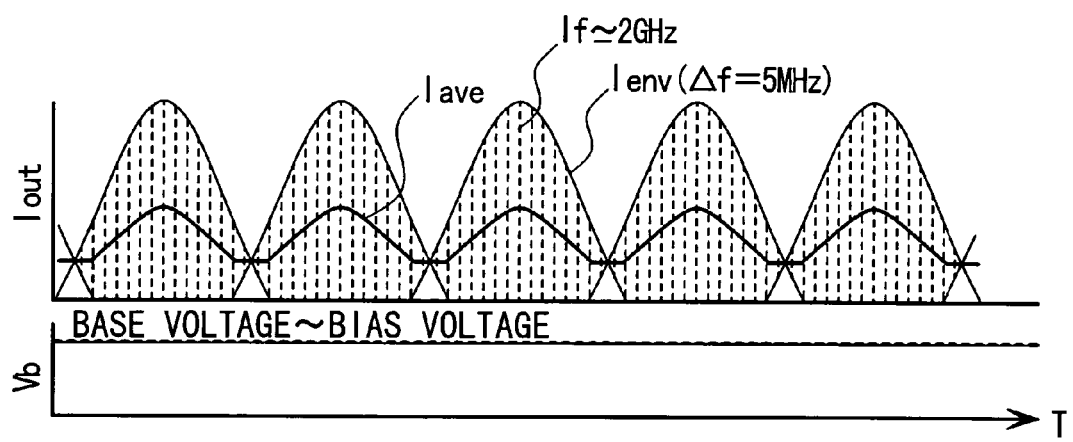
FIG. 3A shows a case of using neither the first nor second means.
Figure 3B:
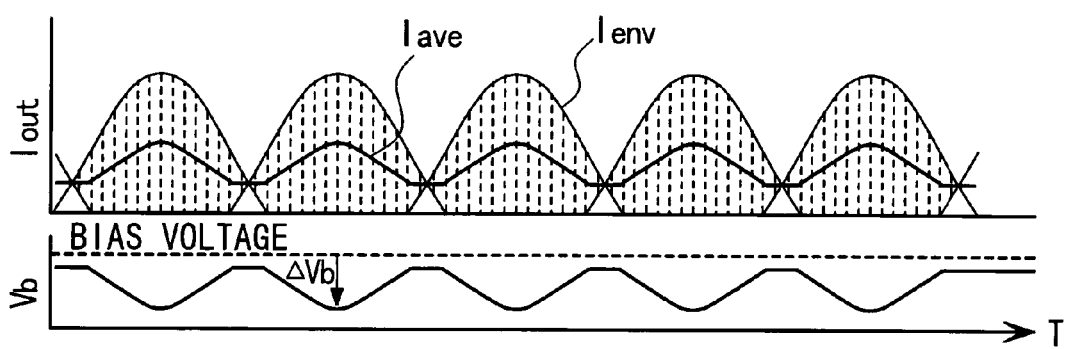
FIG. 3B shows a case of using the first means.
Figure 3C:
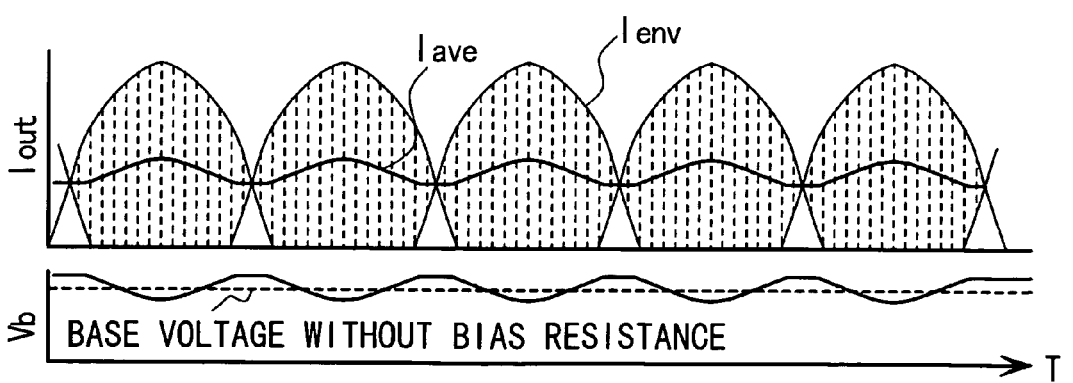
FIG. 3C shows a case of using both the first and second means.
Figure 4:
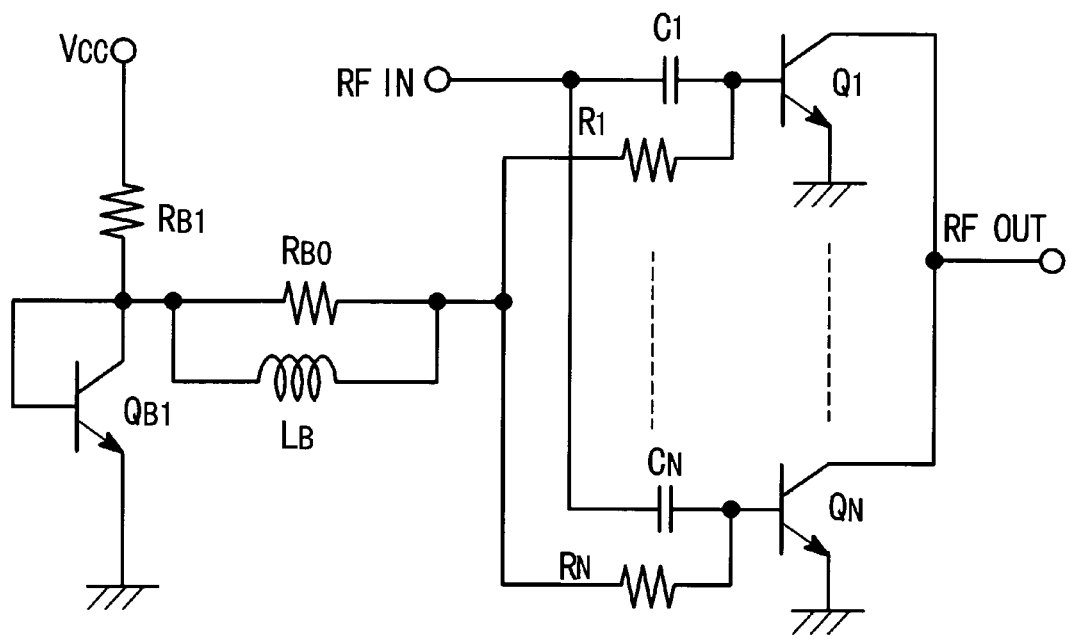
FIG. 4 is a circuit diagram showing a major part of a radio frequency power amplifier according to the second embodiment of the present invention.

FIG. 4 is a circuit diagram showing a major part of a WCDMA compliant radio frequency power amplifier according to the second embodiment of the present invention. The diagram includes an amplifying transistor and a bias circuit connected to its base. FIG. 4 uses the same reference symbols as those for the conventional example and the first embodiment shown in FIG. 2 and a detailed description is omitted for convenience of description.

According to the embodiment, wiring from each base of the transistors $Q_1$ through $Q_N$ branches into two paths. Like the conventional example in FIG. 2, one of the paths unites with the corresponding wiring of the other transistors via one of capacitors $C_1$ through $C_N$ and is connected to the high-frequency input terminal. The other path unites with the corresponding wiring of the other transistors via one of ballast resistors $R_1$ through $R_N$. Unlike the first embodiment, this path is further connected to the collector of the transistor $Q_{B1}$ via the coil $L_B$ and the bias resistor $R_{B0}$ that are connected parallel to each other.

Like the first embodiment, the second embodiment sets the constant voltage supply $V_{CC}$ to 3.4 V and the coil $L_B$ to 10 μH. Unlike the first embodiment, however, the ballast resistors $R_{11}$ through $R_{1N}$ are set to 10 Ω in respective parallel connections. The bias resistor $R_{B0}$ is set to 40 Ω.

The second embodiment can provide the same effects owing to the same operations as for the first embodiment. According to the embodiment, the bias resistor is separated from the ballast resistor and functions independently. The wiring from the amplifying transistor's base branches into two paths. Compared to the first embodiment that uses three wiring branches, the second embodiment provides advantages of simplifying the circuit layout and reducing the circuit footprint Embodiment 3

Figure 5:
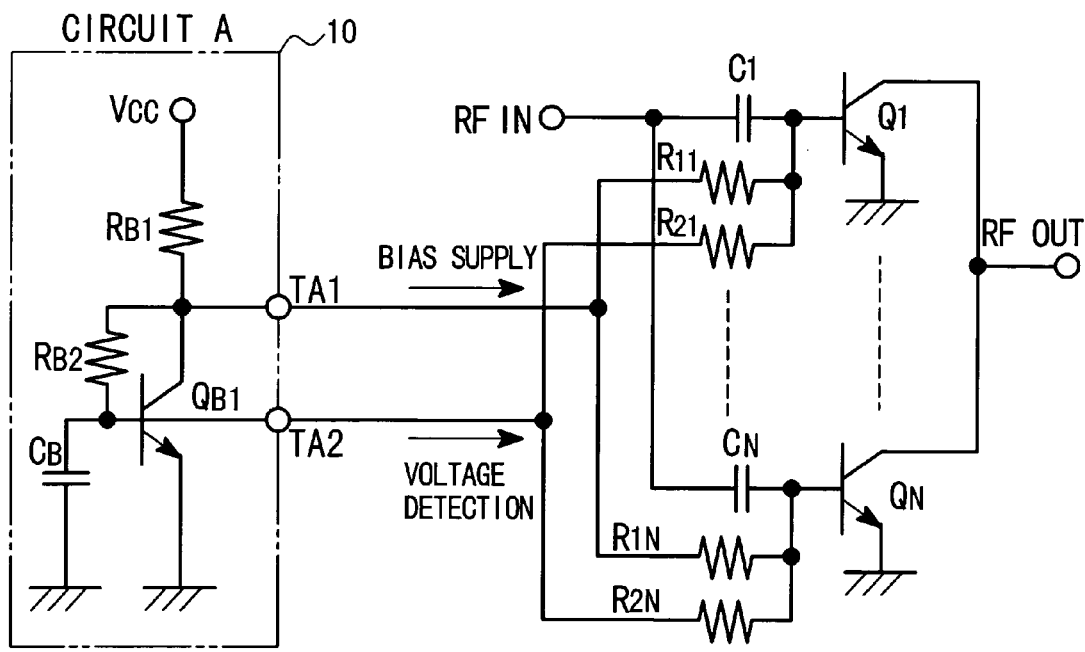
FIG. 5 is a circuit diagram showing a major part of a radio frequency power amplifier according to the third embodiment of the present invention.

FIG. 5 is a circuit diagram showing a major part of a WCDMA compliant radio frequency power amplifier according to the third embodiment of the present invention. The diagram includes an amplifying transistor and a bias circuit connected to its base.

The third to eighth embodiments are combinations of the first means and the second configuration of the second means and provide specific configuration examples for realizing the following function. That is to say, there is provided a bias resistor having a value three to five times greater than that of a conventional ballast resistor. The function detects the amount of decrease in the amplifying transistor's base average voltage due to a voltage drop in the bias resistor. The function automatically increases an output voltage from the base bias circuit so as to compensate this voltage drop. These embodiments have the basic common configuration that comprises circuit components including at least one bipolar transistor configured as follows. The emitter is grounded in the base bias circuit. The base is grounded via the capacitor. The base is connected to the collector via a first resistor. The collector is connected to the constant voltage supply via a second resistor. That circuit component is referred to as a circuit A. A collector node of the circuit A is referred to as a first terminal. A base node thereof is referred to as a second terminal.

The same configuration parts are denoted by the same reference symbols in the following embodiments.

In FIG. 5, the reference symbols $Q_1$ to $Q_N$ denote N equivalent SiGe HBTs; $C_1$ to $C_N$ denote N equivalent capacitors; $R_{11}$ to $R_{1N}$ and $R_{21}$ to $R_{2N}$ respectively denote N equivalent resistors; $Q_{B1}$ denotes an SiGe HBT; $R_{B1}$ and $R_{B2}$ denote resistors; $C_B$ denotes a capacitor; $V_{CC}$ denotes a constant voltage supply; $RF_{in}$ denotes a high-frequency input terminal; and $RF_{out}$ denotes a high-frequency output terminal. $Q_1$ to $Q_N$ function as amplifying transistors; $R_{11}$ to $R_{1N}$ as bias resistors; and $Q_{B1}$, $R_{B1}$, $R_{B2}$, $R_{21}$ to $R_{2N}$, and $C_B$ as a transistor, resistors, and a capacitor of the base bias circuit.

A portion enclosed in the dash-double dot lines in FIG. 5 corresponds to the circuit A constituting the base bias circuit. In the circuit A, the emitter of the transistor $Q_{B1}$ is grounded. The base is grounded via the capacitor $C_B$. The base and the collector are connected to each other via the resistor $R_{B2}$. The collector is connected to the constant voltage supply $V_{CC}$ via the resistor $R_{B1}$. The collector node of the transistor $Q_{B1}$ corresponds to a first terminal $T_{A1}$ of the circuit A. The base node corresponds to a second terminal $T_{A2}$ of the circuit A.

Emitters of the amplifying transistors $Q_1$ to $Q_N$ are grounded. Collectors are connected to the high-frequency output terminal RFout. Wiring from each base branches into three paths. One of the paths joins the corresponding wiring of the other transistors via one of the capacitors $C_1$ through $C_N$ and is connected to the high-frequency input terminal $RF_{in}$. Another path unites with the corresponding wiring of the other transistors via one of bias resistors $R_{11}$ through $R_{1N}$ and is connected to the fist terminal $T_{A1}$ of the circuit A. The remaining path unites with the corresponding wiring of the other transistors and is connected to the second terminal $T_{A2}$ of the circuit A.

Here, the constant voltage supply $V_{CC}$ is set to 3.4 V. The bias resistors $R_{11}$ through $R_{1N}$ are set to 50 Ω in respective parallel connections. The resistors $R_{21}$ through $R_{2N}$ are set to 500 Ω in respective parallel connections. The resistors $R_{B1}$ and $R_{B2}$ are set to 100 Ω and 1 kΩ, respectively. The capacitor $C_B$ is set to 1 nF. A combination of the resistors $R_{21}$ through $R_{2N}$ and the capacitor $C_B$ operates as a low pass filter. Since the capacitor is set to a value large enough to short-circuit a low frequency (approximately 5 MHz), only a direct current flows through the resistor $R_{B2}$. The first terminal $T_{A1}$ of the circuit A mainly supplies a bias voltage to bases of the amplifying transistors $Q_1$ through $Q_N$. The second terminal $T_{A2}$ of the circuit A detects the base voltage.

The circuit according to the embodiment operates as follows and compensates for a decrease in base voltages of the amplifying transistors $Q_1$ through $Q_N$ due to a voltage drop in the bias resistors $R_{11}$ through $R_{1N}$.

When the bias resistor is subject to a voltage drop, the amplifying transistors $Q_1$ through $Q_N$ may be subject to a decrease in base voltages. In such case, a direct current flowing through the resistor $R_{B2}$ in the circuit A increases to decrease the base voltage of the transistor $Q_{B1}$, decreasing a current flowing through the resistor $R_{B2}$. As a result, this increases the voltage of the first terminal $T_{A1}$ and a bias voltage supplied to bases of the amplifying transistors $Q_1$ through $Q_N$. Values of the resistors $R_{B1}$ and $R_{B2}$ in the circuit A and a parameter for the bipolar transistor $Q_{B1}$ are configured so that the increase amount of the bias voltage almost equals the voltage drop amount in the bias resistors $R_{11}$ through $R_{1N}$.

Base currents for the amplifying transistors $Q_1$ through $Q_N$ flow through the bias resistors $R_{11}$, through $R_{1N}$. The corresponding negative feedback relaxes non-linearity caused by the exponential relationship between current and voltage characteristics and suppresses the envelope waveform distortion. On the other hand, an increase in the bias voltage compensates for a decrease in base voltages supplied to the amplifying transistors $Q_1$ through $Q_N$. This decreases a distortion that increases due to a gain decrease at high outputs, improving the maximum linear output power.

Embodiment 4

Figure 6:
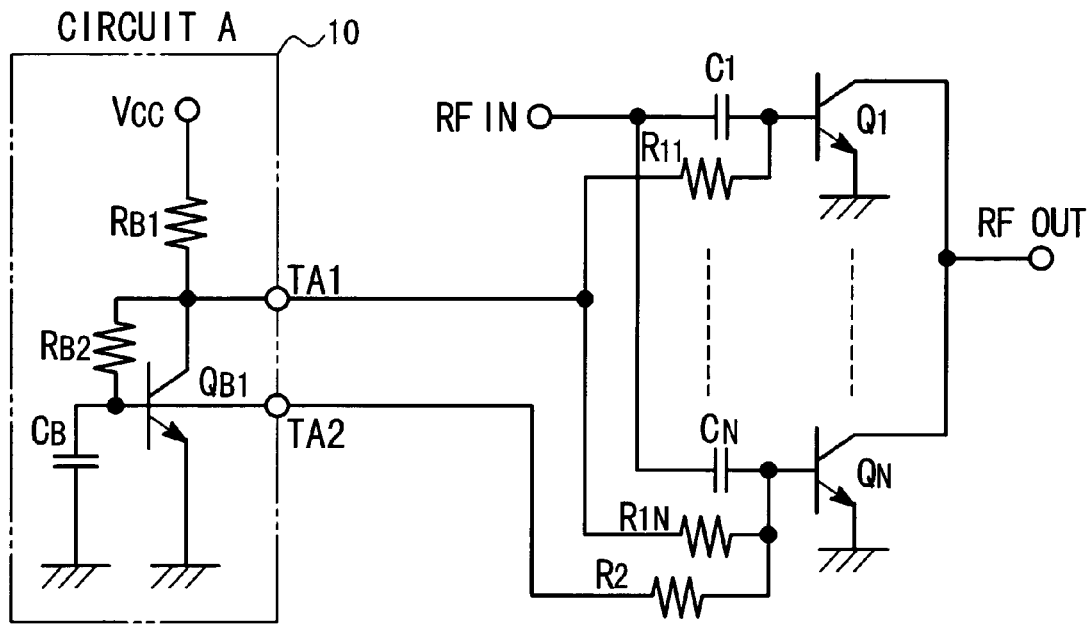
FIG. 6 is a circuit diagram showing a major part of a radio frequency power amplifier according to the fourth embodiment of the present invention.

FIG. 6 is a circuit diagram showing a major part of a WCDMA compliant radio frequency power amplifier according to the fourth embodiment of the present invention. The diagram includes an amplifying transistor and a bias circuit connected to its base. The fourth embodiment uses basically the same connections between components, circuit operations, and effects as for the third embodiment. A difference is that the base is connected to the second terminal $T_{A2}$ of the circuit A via a resistor in order to detect a base voltage.

According to the third embodiment, bases of the amplifying transistors $Q_1$ through $Q_N$ are connected to the second terminal $T_{A2}$ of the circuit A via N resistors $R_{21}$ through $R_{2N}$, respectively. According to the fourth embodiment, on the other hand, only one amplifying transistor is connected to the second terminal $T_{A2}$ via the resistor $R_2$.

This configuration provides advantages of simplifying the circuit layout design and decreasing a circuit footprint. While FIG. 5 shows a connection to the amplifying transistor $Q_N$, it may be preferable to use a connection to any amplifying transistor. While the embodiment uses one amplifying transistor connected to the second terminal $T_{A2}$ of the circuit A, it may be preferable to use a plurality of amplifying transistors fewer than all of them.

Embodiment 5

Figure 7:
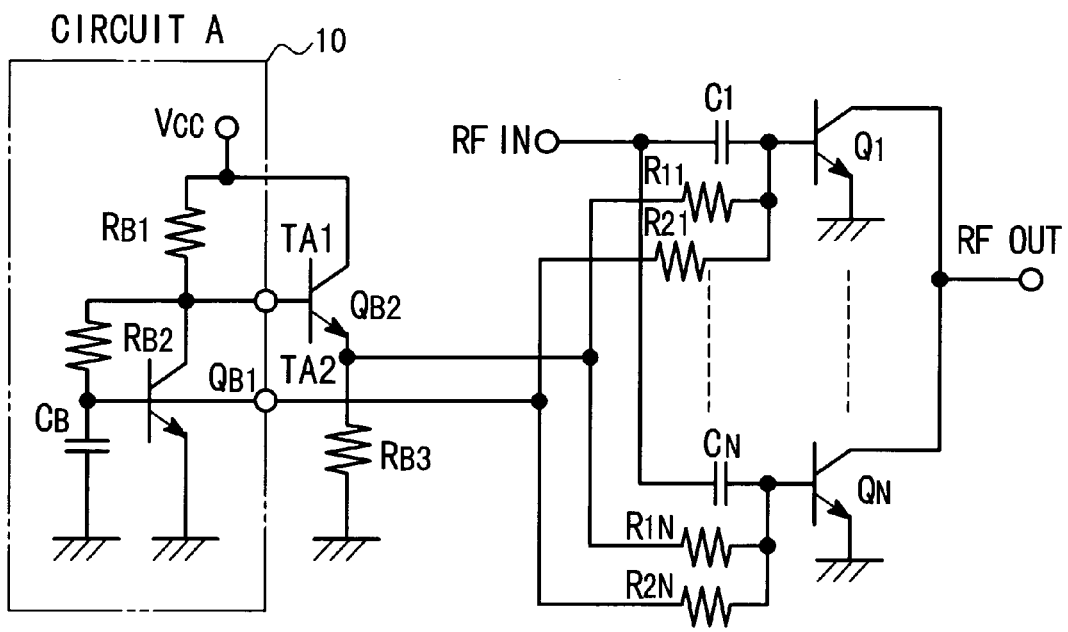
FIG. 7 is a circuit diagram showing a major part of a radio frequency power amplifier according to the fifth embodiment of the present invention.

FIG. 7 is a circuit diagram showing a major part of a WCDMA compliant radio frequency power amplifier according to the fifth embodiment of the present invention. The diagram includes an amplifying transistor and a bias circuit connected to its base.

The fifth embodiment newly adds the transistor $Q_{B2}$, i.e., SiGe HBT, and the resistor $R_{B3}$ as part of the base bias circuit to the configuration of the third embodiment as shown in FIG. 5. The base of the transistor $Q_{B2}$ is connected to the first terminal $T_{A1}$ of the circuit A. The collector is connected to the constant voltage supply $V_{CC}$. The emitter is grounded via the resistor $R_{B3}$ and is connected to bases of the amplifying transistors $Q_1$ through $Q_N$ via the bias resistors $R_{11}$ through $R_{1N}$. Like the third embodiment, the second terminal $T_{A2}$ of the circuit A is connected to bases of the amplifying transistors $Q_1$ through $Q_N$ via the resistors $R_{21}$ through $R_{2N}$.

Here, the constant voltage supply $V_{CC}$ is set to 3.4 V. The bias resistors $R_{11}$ through $R_{1N}$ are set to 50 Ω in respective parallel connections. The resistors $R_{21}$ through $R_{2N}$ are set to 500 Ω in respective parallel connections. The resistors $R_{B1}$ and $R_{B2}$ in the circuit A are set to 100 Ω and 1 kΩ, respectively. The capacitor $C_B$ is set to 1 nF.

The circuit according to the embodiment operates as follows and compensates for a decrease in base voltages of the amplifying transistors $Q_1$ through $Q_N$ due to a voltage drop in the bias resistors $R_{11}$ through $R_{1N}$.

When the bias resistor is subject to a voltage drop, the amplifying transistors $Q_1$ through $Q_N$ may be subject to a decrease in base voltages. In such case, there occurs an increase in a voltage at the first terminal $T_{A1}$ of the circuit A like the third embodiment. In addition, there occurs an increase in voltages for the base and the emitter of the transistor $Q_{B2}$. As a result, there occurs an increase in bias voltages supplied to the bases of the amplifying transistors $Q_1$ through $Q_N$. Values of the resistors $R_{B1}$ and $R_{B2}$ in the circuit A and a parameter for the bipolar transistor $Q_{B1}$ are configured so that the increase amount of the bias voltage almost equals the voltage drop amount in the bias resistors $R_{11}$ through $R_{1N}$.

Effects of the fifth embodiment are basically the same as those of the third embodiment. Moreover, the fifth embodiment adds an emitter follower circuit comprising the transistor $Q_{B2}$ and the resistor $R_{B3}$. Even if a bias voltage fluctuates due to variations of an average base current for the amplifying transistors $Q_1$ through $Q_N$ at low frequencies, it is possible to reduce such fluctuation compared to the third embodiment. As a result, there is provided an advantage of further decreasing an amplification distortion.

Embodiment 6

Figure 8:
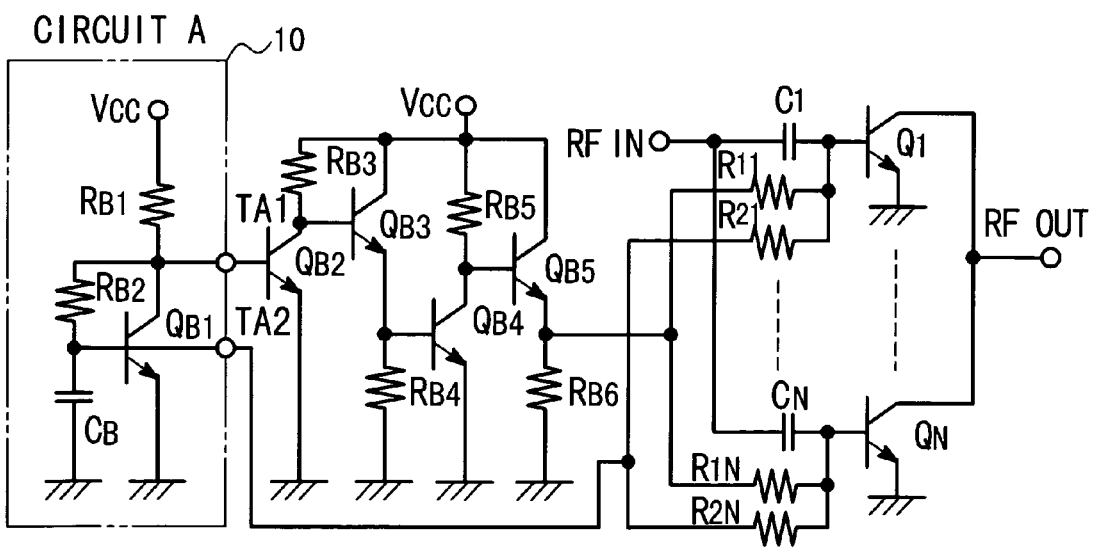
FIG. 8 is a circuit diagram showing a major part of a radio frequency power amplifier according to the sixth embodiment of the present invention.

FIG. 8 is a circuit diagram showing a major part of a WCDMA compliant radio frequency power amplifier according to the sixth embodiment of the present invention. The diagram includes an amplifying transistor and a bias circuit connected to its base.

The sixth embodiment differs from the third embodiment shown in FIG. 5 as follows. The sixth embodiment newly adds the transistors $Q_{B2}$, $Q_{B3}$, $Q_{B4}$, and $Q_{B5}$, i.e., SiGe HBTs, and the resistors $R_{B3}$, $R_{B4}$, $R_{B5}$, and $R_{B6}$ as part of the bias circuit to the configuration of the third embodiment as shown in FIG. 5.

The base of the transistor $Q_{B2}$ is connected to the first terminal $T_{A1}$ of the circuit A. The emitter is grounded. The collector is connected to the constant voltage supply $V_{CC}$ via the resistor $R_{B3}$ and is connected to the base of the transistor $Q_{B3}$. The collector of the transistor $Q_{B3}$ is connected to the constant voltage supply $V_{CC}$. The emitter is grounded via the resistor $R_{B4}$ and is connected to the base of the transistor $Q_{B4}$. The emitter of the transistor $Q_{B4}$ is grounded. The collector is connected to the constant voltage supply $V_{CC}$ via the resistor $R_{B5}$ and is connected to the base of the transistor $Q_{B5}$. The collector of the transistor $Q_{B5}$ is connected to the constant voltage supply $V_{CC}$. The emitter is grounded via the resistor $R_{B6}$ and is connected to the bases of the amplifying transistors $Q_1$ through $Q_N$ via the bias resistors $R_{11}$ through $R_{1N}$. Like the third embodiment, the second terminal $T_{A2}$ of the circuit A is connected to the bases of the amplifying transistors $Q_1$ through $Q_N$ via the resistors $R_{21}$ through $R_{2N}$.

Here, the constant voltage supply $V_{CC}$ is set to 3.4 V. The bias resistors $R_{11}$ through $R_{1N}$ are set to 50 Ω in respective parallel connections. The resistors $R_{21}$ through $R_{2N}$ are set to 500 Ω in respective parallel connections. The resistors $R_{B1}$ and $R_{B2}$ are set to 100 Ω and 1 kΩ, respectively. The capacitor $C_B$ is set to 1 nF.

The circuit according to the embodiment operates as follows and compensates for a decrease in base voltages of the amplifying transistors $Q_1$ through $Q_N$ due to a voltage drop in the bias resistors $R_{11}$ through $R_{1N}$.

When the bias resistor is subject to a voltage drop, the amplifying transistors $Q_1$ through $Q_N$ may be subject to a decrease in base voltages. In such case, there occurs an increase in a voltage at the first terminal $T_{A1}$ of the circuit A like the third embodiment. This increases a voltage to the base of the transistor $Q_{B2}$ to increase a current flowing through the resistor $R_{B3}$. This then decreases voltages to the base and the emitter of the transistor $Q_{B3}$. This decreases a voltage to the base of the transistor $Q_{B4}$ to decrease a current flowing through the resistor $R_{B5}$. This then increases voltages to the base and the emitter of the transistor $Q_{B5}$. As a result, there occurs an increase in bias voltages supplied to the bases of the amplifying transistors $Q_1$ through $Q_N$. Values of the resistors $R_{B1}$ and $R_{B2}$ in the circuit A and a parameter for the bipolar transistor $Q_{B1}$ are configured so that the increase amount of the bias voltage almost equals the voltage drop amount in the bias resistors $R_{11}$ through $R_{1N}$.

Effects of the sixth embodiment are basically the same as those of the third embodiment. Moreover, the sixth embodiment adds circuit components comprising the transistors $Q_{B2}$ through $Q_{B5}$ and $R_{B3}$ through $R_{B6}$. Even if a bias voltage fluctuates due to variations of an average base current for the amplifying transistors $Q_1$ through $Q_N$ at low frequencies, it is possible to reduce such fluctuation compared to the third embodiment. As a result, there is provided an advantage of further decreasing amplification distortion. Further, it is possible to decrease the temperature dependence of bias voltages compared to the third embodiment. As a result, there is also provided an effect of decreasing the temperature dependence of amplification distortion.

Embodiment 7

Figure 9:
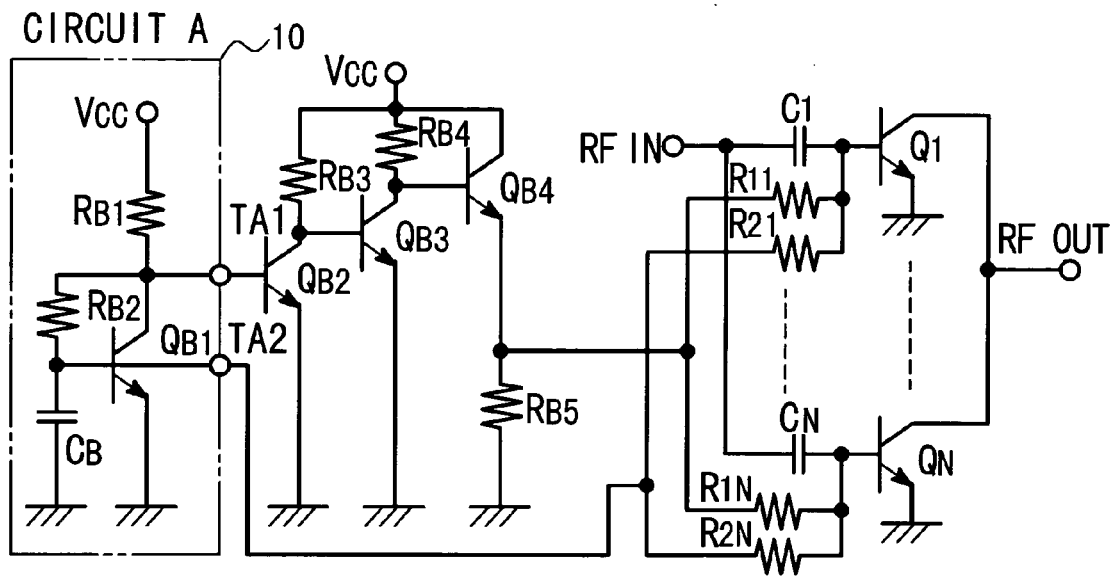
FIG. 9 is a circuit diagram showing a major part of a radio frequency power amplifier according to the seventh embodiment of the present invention.

FIG. 9 is a circuit diagram showing a major part of a WCDMA compliant radio frequency power amplifier according to the seventh embodiment of the present invention. The diagram includes an amplifying transistor and a bias circuit connected to its base.

The seventh embodiment differs from the third embodiment shown in FIG. 5 as follows. The seventh embodiment newly adds the transistors $Q_{B2}$, $Q_{B3}$, and $Q_{B4}$, i.e., SiGe HBTs, and the resistors $R_{B3}$, $R_{B4}$, and $R_{B5}$ as part of the bias circuit to the configuration of the third embodiment as shown in FIG. 5.

The base of the transistor $Q_{B2}$ is connected to the first terminal $T_{A1}$ of the circuit A. The emitter is grounded. The collector is connected to the constant voltage supply $V_{CC}$ via the resistor $R_{B3}$ and is connected to the base of the transistor $Q_{B3}$. The emitter of the transistor $Q_{B3}$ is grounded. The collector is connected to the constant voltage supply $V_{CC}$ via the resistor $R_{B4}$ and is connected to the base of the transistor $Q_{B4}$. The emitter of the transistor $Q_{B4}$ is grounded via the resistor $R_{B5}$ and is connected to the bases of the amplifying transistors $Q_1$ through $Q_N$ via the bias resistors $R_{11}$ through $R_{1N}$. Like the third embodiment, the second terminal $T_{A2}$ of the circuit A is connected to the bases of the amplifying transistors $Q_1$ through $Q_N$ via the resistors $R_{21}$ through $R_{2N}$.

Here, the constant voltage supply $V_{CC}$ is set to 3.4 V. The bias resistors $R_{11}$ through $R_{1N}$ are set to 50 Ω in respective parallel connections. The resistors $R_{21}$ through $R_{2N}$ are set to 500 Ω in respective parallel connections. The resistors $R_{B1}$ and $R_{B2}$ are set to 100 Ω and 1 kΩ, respectively. The capacitor $C_B$ is set to 1 nF.

The circuit according to the embodiment operates as follows and compensates for a decrease in base voltages of the amplifying transistors $Q_1$ through $Q_N$ due to a voltage drop in the bias resistors $R_{11}$ through $R_{1N}$.

When the bias resistor is subject to a voltage drop, the amplifying transistors $Q_1$ through $Q_N$ may be subject to a decrease in base voltages. In such case, there occurs an increase in a voltage at the first terminal $T_{A1}$ of the circuit A like the third embodiment. This increases a voltage to the base of the transistor $Q_{B2}$ to increase a current flowing through the resistor $R_{B3}$. This decreases a voltage to the base of the transistor $Q_{B3}$ to decrease a current flowing through the resistor $R_{B4}$. This then increases voltages to the base and the emitter of the transistor $Q_{B4}$. As a result, there occurs an increase in bias voltages supplied to the bases of the amplifying transistors $Q_1$ through $Q_N$. Values of the resistors $R_{B1}$ and $R_{B2}$ in the circuit A and a parameter for the bipolar transistor $Q_{B1}$ are configured so that the increase amount of the bias voltage almost equals the voltage drop amount in the bias resistors $R_{11}$ through $R_{1N}$.

Effects of the seventh embodiment are basically the same as those of the sixth embodiment.

Embodiment 8

Figure 10:
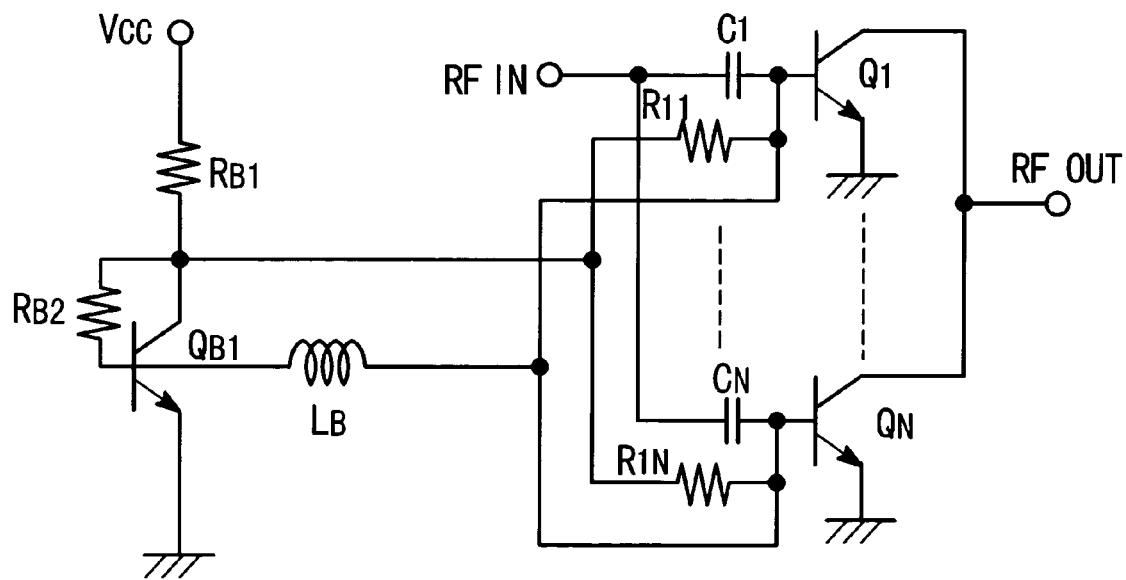
FIG. 10 is a circuit diagram showing a major part of a radio frequency power amplifier according to the eighth embodiment of the present invention.

FIG. 10 is a circuit diagram showing a major part of a WCDMA compliant radio frequency power amplifier according to the eighth embodiment of the present invention. The diagram includes an amplifying transistor and a bias circuit connected to its base.

The eighth embodiment is configured by removing the capacitor $C_B$ and the resistors $R_{21}$ through $R_{2N}$ from the third embodiment as shown in FIG. 5 and inserting the coil $L_B$ instead.

Here, the constant voltage supply $V_{CC}$ is set to 3.4 V. The bias resistors $R_{11}$ through $R_{1N}$ are set to 50 Ω in respective parallel connections. The resistors $R_{B1}$ and $R_{B2}$ are set to 100 Ω and 1 kΩ, respectively. An inductance of the coil $L_B$ is set to 10 μH. Since the inductance of the coil $L_B$ is set to a value large enough to cut off a low-frequency component (approximately 5 MHz), only a direct current component flows through the resistor $R_{B2}$.

Based on this configuration, the circuit according to the embodiment operates as follows and compensates for a decrease in base voltages of the amplifying transistors $Q_1$ through $Q_N$ due to a voltage drop in the bias resistors $R_{11}$ through $R_{1N}$.

When the bias resistor is subject to a voltage drop, the amplifying transistors $Q_1$ through $Q_N$ may be subject to a decrease in base voltages. In such case, a direct current flowing through the resistor $R_{B2}$ increases to decrease the base voltage of the transistor $Q_{B1}$. On the other hand, there is provided the coil $L_B$ between the base of the amplifying transistor and the resistor $R_{B2}$. The coil $L_B$ is large enough to prevent low-frequency components in a bias voltage to the amplifying transistor. Accordingly, there occurs a decrease in the bias voltage to the bipolar transistor $Q_{B1}$ of the circuit A only due to an increase in direct current components of a current flowing to the base of the amplifying transistor from the second terminal $T_{A2}$ of the circuit A. A decrease in the bias voltage drops a current flowing through the resistor $R_{B2}$ of the circuit A. As a result, this increases a collector voltage to the transistor $Q_{B1}$ and also increases a bias voltage to the bases of the amplifying transistors $Q_1$ through $Q_N$. Values of the resistors $R_{B1}$ and $R_{B2}$ in the circuit A and a parameter for the bipolar transistor $Q_{B1}$ are configured so that the increase amount of the bias voltage almost equals the voltage drop amount in the bias resistors $R_{11}$ through $R_{1N}$.

Effects of the eighth embodiment are basically the same as those of the third embodiment. As explained in this embodiment, it is also possible to remove the capacitor $C_B$ and the resistors $R_{21}$ through $R_{2N}$ from the fourth to sixth embodiments and insert the coil $L_B$ instead. In this manner, it is possible to provide the radio frequency power amplifier having basically the same effects as for the fourth to sixth embodiments.

Embodiment 9

Figure 11:
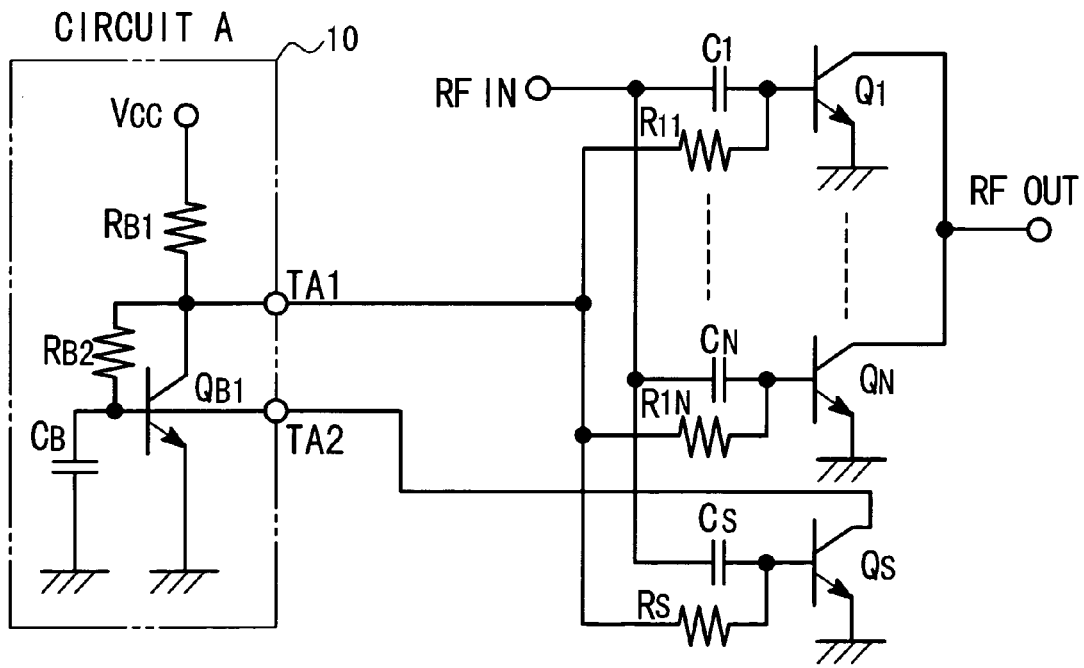
FIG. 11 is a circuit diagram showing a major part of a radio frequency power amplifier according to the ninth embodiment of the present invention.

FIG. 11 is a circuit diagram showing a major part of a WCDMA compliant radio frequency power amplifier according to the ninth embodiment of the present invention. The diagram includes an amplifying transistor and a bias circuit connected to its base.

The ninth to fifteenth embodiments are combinations of the first means and the third configuration of the second means and provide specific configuration examples for realizing the following function. That is to say, there is provided a bias resistor having a value three to five times greater than that of a conventional ballast resistor. The function detects an average output current for the amplifying transistor. The function then automatically increases the output voltage from the base bias circuit for an appropriate value in proportion to the detected value.

Of these embodiments, the ninth to twelfth embodiments are configured to include the circuit A in the base bias circuit. The thirteenth to fifteenth embodiments are configured to include the circuit B. The circuit B comprises circuit components including at least one bipolar transistor configured as follows. The emitter is grounded via the first resistor or via the first resistor and a diode for level shift. The base is grounded via the capacitor and is connected to the constant voltage supply via the second resistor. The collector is connected to the constant voltage supply. In the circuit B, an emitter-side node of the bipolar transistor is referred to as a first terminal of the circuit B. A base node thereof is referred to as a second terminal of the circuit B. It may be preferable to insert diodes (including a diode connecting between the base and the collector of the transistor) between the bipolar transistor's emitter and the second resistor for optimization of emitter node voltages.

The ninth embodiment in FIG. 11 differs from the third embodiment in FIG. 5 as follows. The ninth embodiment removes the path from the bases of the amplifying transistors $Q_1$ through $Q_N$ to the second terminal $T_{A2}$ of the circuit A via the resistors $R_{21}$ through $R_{2N}$. Instead, there is provided a transistor $Q_S$ for detecting average output currents from the amplifying transistors $Q_1$ through $Q_N$ as well as a resistor $R_S$ and a capacitor $C_S$. Consequently, there are differences in reference amounts for automatically changing a bias voltage supplied to the bases of the amplifying transistors $Q_1$ through $Q_N$ as follows. The third embodiment uses a bias voltage for the amplifying transistors $Q_1$ through $Q_N$ as the reference amount for this purpose. On the other hand, the ninth embodiment uses an average output current $I_{ave}$ for the amplifying transistors $Q_1$ through $Q_N$ as the reference amount.

Wiring from the base of the transistor $Q_S$ for average output current detection branches into two paths like the amplifying transistors $Q_1$ through $Q_N$. One path is connected to the high-frequency input terminal $RF_{in}$ via the capacitor $C_S$. The other path is connected to the first terminal $T_{A1}$ of the circuit A via the resistor $R_S$. The emitter of the detection transistor $Q_S$ is grounded. The collector is connected to the second terminal $T_{A2}$ of the circuit A.

Here, the constant voltage supply $V_{CC}$ is set to 3.4 V. The bias resistors $R_{11}$ through $R_{1N}$ are set to 50 Ω in respective parallel connections. The resistors $R_{B1}$ and $R_{B2}$ are set to 100 Ω and 1 kΩ, respectively. The capacitor $C_B$ is set to 1 nF. The detection transistor $Q_S$ is equivalent to the amplifying transistors $Q_1$ through $Q_N$. The resistor $R_S$ and the capacitor $C_S$ are equivalent to the resistors $R_{11}$ through $R_{1N}$ and the capacitors $C_1$ through $C_N$, respectively. Since the capacitor $C_B$ is set to a value large enough to short-circuit a low frequency (approximately 5 MHz), only a direct current flows through the resistor $R_{B2}$. The first terminal $T_{A1}$ of the circuit A mainly supplies a bias voltage to the base of the amplifying transistor. The second terminal $T_{A2}$ detects an average output current from the amplifying transistor.

The circuit according to the embodiment is configured in this manner and uses the detection transistor $Q_S$ to detect an amount proportional to the average output current $I_{ave}$ from the amplifying transistors $Q_1$ through $Q_N$. This amount is hereafter referred to as an average output current proportional amount. The detection operation is used to automatically change a bias voltage supplied to the bases of the amplifying transistors $Q_1$ through $Q_N$. The detection operation will be described below.

The detection transistor $Q_S$ is supplied with the same direct current bias and the same high-frequency input as for the amplifying transistors $Q_1$ through $Q_N$. Accordingly, the output current, i.e., the collector current becomes almost the same as for each of the amplifying transistors $Q_1$ through $Q_N$. Therefore, it is possible to estimate an output current for all the amplifying transistors by detecting the collector current for the detection transistor $Q_S$. As a result, it is also possible to estimate a base current for all the amplifying transistors and a voltage drop in the bias resistors $R_{11}$ through $R_{1N}$ due to the base current.

When a collector current increases in the detection transistor $Q_S$, the capacitor $C_B$ short-circuits low-frequency components of the collector current, increasing a direct current flowing through the resistor $R_{B2}$. This decreases the base voltage of the transistor $Q_{B1}$ in the circuit A, decreasing a current flowing through the resistor $R_{B1}$. As a result, this increases the voltage at the first terminal $T_{A1}$ of the circuit A and a bias voltage supplied to the bases of the amplifying transistors $Q_1$ through $Q_N$. Values of the resistors $R_{B1}$ and $R_{B2}$ in the circuit A and a parameter for the bipolar transistor $Q_{B1}$ are configured so that the increase amount of the bias voltage almost equals the voltage drop amount in the bias resistors $R_{11}$ through $R_{1N}$.

Effects of the ninth embodiment are basically the same as those of the third embodiment.

Embodiment 10

Figure 12:
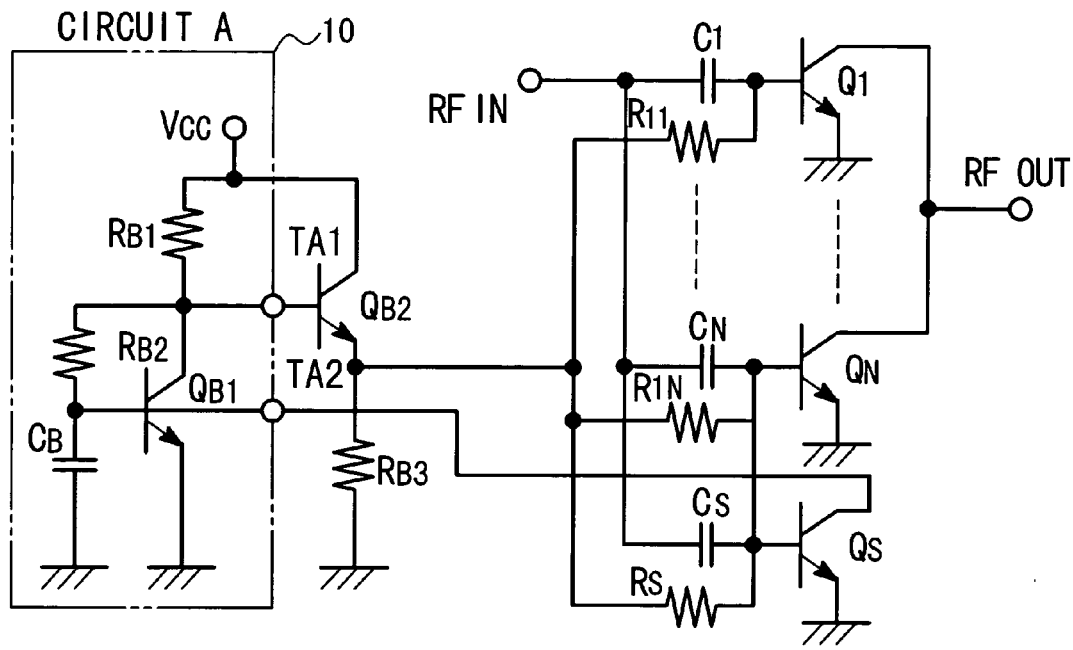
FIG. 12 is a circuit diagram showing a major part of a radio frequency power amplifier according to the tenth embodiment of the present invention.

FIG. 12 is a circuit diagram showing a major part of a WCDMA compliant radio frequency power amplifier according to the tenth embodiment of the present invention. The diagram includes an amplifying transistor and a bias circuit connected to its base. The tenth embodiment differs from the fifth embodiment in FIG. 7 as follows. The tenth embodiment removes the path from the bases of the amplifying transistors $Q_1$ through $Q_N$ to the second terminal $T_{A2}$ of the circuit A via the resistors $R_{21}$ through $R_{2N}$. Instead, there is provided the transistor $Q_S$ for detecting average output currents from the amplifying transistors $Q_1$ through $Q_N$ as well as a resistor $R_S$ and a capacitor $C_S$. The other operations in the configuration are the same as those for the fifth embodiment.

The circuit according to the embodiment is configured in this manner and uses the transistor $Q_S$ to detect an average output current proportional amount from the amplifying transistors $Q_1$ through $Q_N$. The detection operation is used to automatically change a bias voltage supplied to the bases of the amplifying transistors $Q_1$ through $Q_N$. The detection operation will be described below.

When a collector current increases in the detection transistor $Q_S$, a voltage increases at the first terminal $T_{A1}$ in the circuit A like the ninth embodiment. This increases voltages for the base and the emitter of the transistor $Q_{B2}$. As a result, this increases a bias voltage supplied to the bases of the amplifying transistors $Q_1$ through $Q_N$. Values of the resistors $R_{B1}$ and $R_{B2}$ in the circuit A and a parameter for the bipolar transistor $Q_{B1}$ are configured so that the increase amount of the bias voltage almost equals the voltage drop amount in the bias resistors $R_{11}$ through $R_{1N}$.

Effects of the tenth embodiment are basically the same as those of the fifth embodiment.

Embodiment 11

Figure 13:
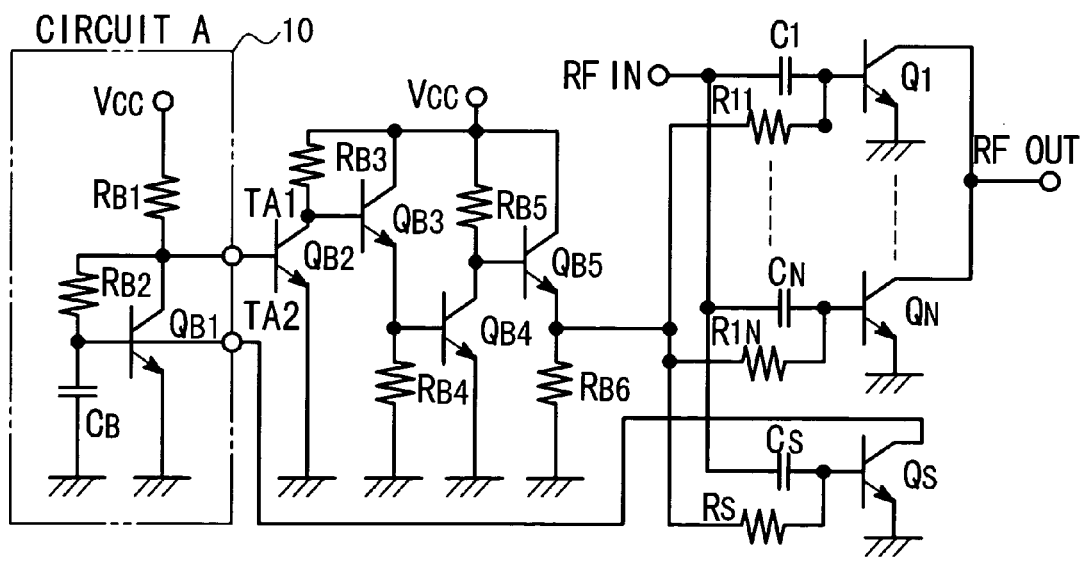
FIG. 13 is a circuit diagram showing a major part of a radio frequency power amplifier according to the eleventh embodiment of the present invention.

FIG. 13 is a circuit diagram showing a major part of a WCDMA compliant radio frequency power amplifier according to the eleventh embodiment of the present invention. The diagram includes an amplifying transistor and a bias circuit connected to its base.

The eleventh embodiment differs from the sixth embodiment in FIG. 8 as follows. The eleventh embodiment removes the path from the bases of the amplifying transistors $Q_1$ through $Q_N$ to the second terminal $T_{A2}$ of the circuit A via the resistors $R_{21}$ through $R_{2N}$. Instead, there is provided the transistor $Q_S$ for detecting average output currents from the amplifying transistors $Q_1$ through $Q_N$ as well as a resistor $R_S$ and a capacitor $C_S$. The other operations in the configuration are the same as those for the sixth embodiment.

The circuit according to the embodiment is configured in this manner and uses the transistor $Q_S$ to detect an average output current proportional amount from the amplifying transistors $Q_1$ through $Q_N$. The detection operation is used to automatically change a bias voltage supplied to the bases of the amplifying transistors $Q_1$ through $Q_N$. The detection operation will be described below.

When a collector current increases in the detection transistor $Q_S$, a voltage increases at the first terminal $T_{A1}$ in the circuit A like the ninth embodiment. This increases a voltage for the base of the transistor $Q_{B2}$ and increases a current flowing through the resistor $R_{B3}$. This current increase then decreases voltages to the base and the emitter of the transistor $Q_{B3}$. This voltage drop decreases a voltage to the base of the transistor $Q_{B4}$ to decrease a current flowing through the resistor $R_{B5}$. This current decrease then increases voltages to the base and the emitter of the transistor $Q_{B5}$. As a result, there occurs an increase in bias voltages supplied to the bases of the amplifying transistors $Q_1$ through $Q_N$. Values of the resistors $R_{B1}$ and $R_{B2}$ in the circuit A and a parameter for the bipolar transistor $Q_{B1}$ are configured so that the increase amount of the bias voltage almost equals the voltage drop amount in the bias resistors $R_{11}$ through $R_{1N}$.

Effects of the eleventh embodiment are basically the same as those of the sixth embodiment.

Embodiment 12

Figure 14:
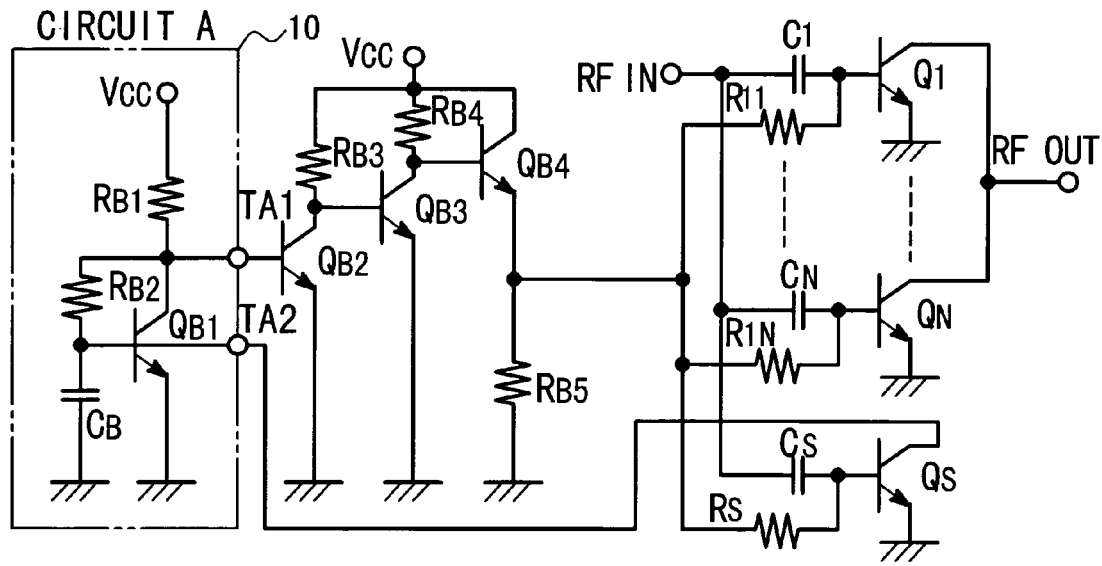
FIG. 14 is a circuit diagram showing a major part of a radio frequency power amplifier according to the twelfth embodiment of the present invention.

FIG. 14 is a circuit diagram showing a major part of a WCDMA compliant radio frequency power amplifier according to the twelfth embodiment of the present invention. The diagram includes an amplifying transistor and a bias circuit connected to its base.

The twelfth embodiment differs from the seventh embodiment in FIG. 9 as follows. The eleventh embodiment removes the path from the bases of the amplifying transistors $Q_1$ through $Q_N$ to the second terminal $T_{A2}$ of the circuit A via the resistors $R_{21}$ through $R_{2N}$. Instead, there is provided the transistor $Q_S$ for detecting average output currents from the amplifying transistors $Q_1$ through $Q_N$ as well as a resistor $R_S$ and a capacitor $C_S$. The other operations in the configuration are the same as those for the seventh embodiment.

The circuit according to the embodiment is configured in this manner and uses the transistor $Q_S$ to detect an average output current proportional amount from the amplifying transistors $Q_1$ through $Q_N$. The detection operation is used to automatically change a bias voltage supplied to the bases of the amplifying transistors $Q_1$ through $Q_N$. The detection operation will be described below.

When a collector current increases in the detection transistor $Q_S$, a voltage increases at the first terminal $T_{A1}$ in the circuit A like the ninth embodiment. This voltage increase also increases a voltage for the base of the transistor $Q_{B2}$ and increases a current flowing through the resistor $R_{B3}$. This current increase then decreases a voltage to the base of the transistor $Q_{B3}$ and decreases a current flowing through the resistor $R_{B4}$. This current decrease then increases voltages to the base and the emitter of the transistor $Q_{B4}$. As a result, there occurs an increase in bias voltages supplied to the bases of the amplifying transistors $Q_1$ through $Q_N$. Values of the resistors $R_{B1}$ and $R_{B2}$ in the circuit A and a parameter for the bipolar transistor $Q_{B1}$ are configured so that the increase amount of the bias voltage almost equals the voltage drop amount in the bias resistors $R_{11}$ through $R_{1N}$.

Effects of the twelfth embodiment are basically the same as those of the seventh embodiment.

Embodiment 13

Figure 15:
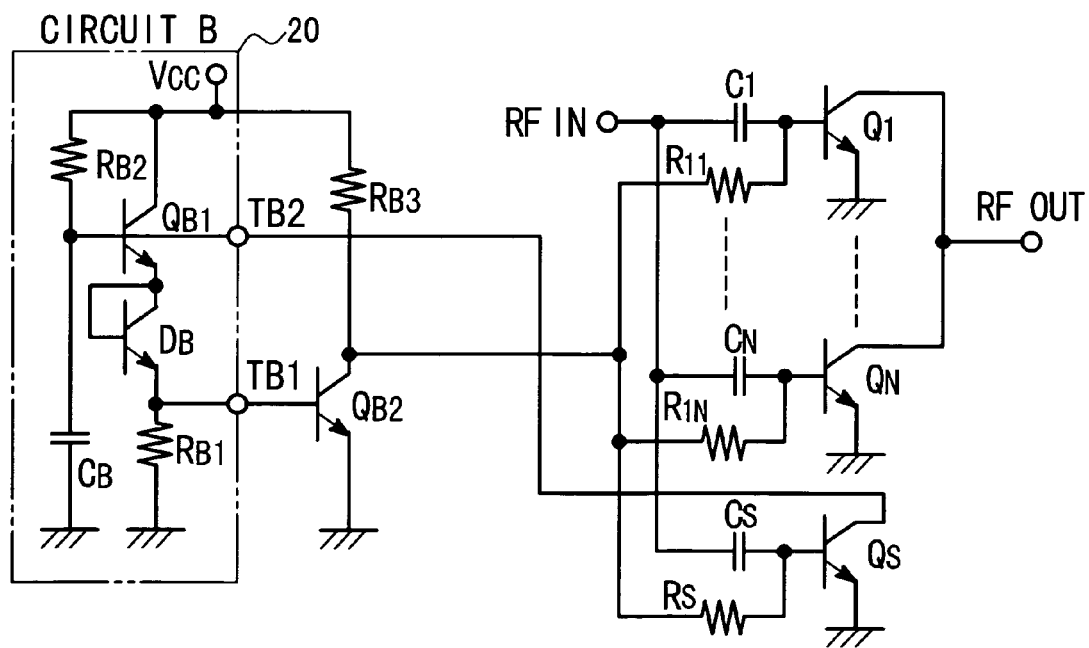
FIG. 15 is a circuit diagram showing a major part of a radio frequency power amplifier according to the thirteenth embodiment of the present invention.

FIG. 15 is a circuit diagram showing a major part of a WCDMA compliant radio frequency power amplifier according to the thirteenth embodiment of the present invention. The diagram includes an amplifying transistor and a bias circuit connected to its base.

In this embodiment, the reference symbols $Q_1$ to $Q_N$ denote N equivalent SiGe HBTs; $C_1$ to $C_N$ denote N equivalent capacitors; $R_{11}$ to $R_{1N}$ denote N equivalent resistors; $Q_{B1}$, $Q_{B2}$, and $Q_S$ denote SiGe HBTS; DB denotes a diode that short-circuits the base and the collector of the SiGe HBT; $R_{B1}$, $R_{B2}$, $R_{B3}$, and $R_S$ denote resistors; $C_B$ and $C_S$ denote capacitors; $V_{CC}$ denotes a constant voltage supply; $RF_{in}$ denotes a high-frequency input terminal; and RFout denotes a high-frequency output terminal. $Q_1$ to $Q_N$ function as amplifying transistors; $R_{11}$ to $R_{1N}$ as bias resistors; and $Q_{B1}$, $R_{B1}$, $R_{B2}$, and $C_B$ as a transistor, resistors, and a capacitor of the base bias circuit.

The diode $D_B$ is inserted for level shift. A plurality of diode $D_B$s may be serially connected depending on resistance values or transistor's parameter values. The transistor $Q_S$ operates to detect an average output current. A portion enclosed in the dash-double dot lines in FIG. 15 corresponds to the above-mentioned circuit B. In the circuit B, the collector of the transistor $Q_{B1}$ is connected to the constant voltage supply $V_{CC}$. The base is grounded via the capacitor $C_B$. The base and the collector are connected to each other via the resistor $R_{B2}$. The emitter is grounded via the resistor $R_{B1}$ and the level shift diode. It should be noted that the level shift diode makes it possible to ignore a voltage variation due to a current variation. The number of level shift diodes depends on configurations. Accordingly, the following description simply uses an expression such as "the emitter is connected to the resistor $R_{B1}$" instead of referring to the level shift diode. An emitter-side node of the transistor $Q_{B1}$ is referred to as a first terminal $T_{B1}$ of the circuit B. A base node thereof is referred to as a second terminal $T_{B2}$ of the circuit B.

Emitters of the amplifying transistors $Q_1$ to $Q_N$ are grounded. Collectors are connected to the high-frequency output terminal RFout. Wiring from each base branches into two paths. One joins the corresponding wiring of the other transistors via one of the capacitors $C_1$ through $C_N$ and is connected to the high-frequency input terminal $RF_{in}$. The other unites with the corresponding wiring of the other transistors via one of bias resistors $R_{11}$ through $R_{1N}$ and is connected to the collector of the transistor $Q_{B2}$.

The base of the transistor $Q_{B2}$ is connected to the first terminal $T_{B1}$ of the circuit B. The emitter is grounded. The collector is connected to the constant voltage supply $V_{CC}$ via the resistor $R_{B3}$. Wiring from the base of the transistor $Q_S$ branches into two paths like the amplifying transistors $Q_1$ through $Q_N$. One is connected to the high-frequency input terminal $RF_{in}$ via the capacitor $C_S$. The other is connected to the collector of the transistor $Q_{B2}$ via the resistor $R_S$. The emitter of the detection transistor $Q_S$ is grounded. The collector is connected to the second terminal $T_{B2}$ of the circuit B.

Here, the constant voltage supply $V_{CC}$ is set to 3.4 V. The bias resistors $R_{11}$ through $R_{1N}$ are set to 50 Ω in respective parallel connections. The $R_{B1}$ and $R_{B2}$ are set to 100 Ω and 1 kΩ, respectively. The capacitor $C_B$ is set to 1 nF. The detection transistor $Q_S$ is equivalent to the amplifying transistors $Q_1$ through $Q_N$. The resistor $R_S$ and the capacitor $C_S$ are equivalent to the bias resistors $R_{11}$ through $R_{1N}$ and the capacitors $C_1$ through $C_N$, respectively. Since the capacitor $C_B$ is set to a value large enough to short-circuit a low frequency (approximately 5 MHz), only a direct current flows through the resistor $R_{B2}$.

The circuit according to the embodiment is configured in this manner and uses the transistor $Q_S$ to detect an average output current proportional amount from the amplifying transistors $Q_1$ through $Q_N$. The detection operation is used to automatically change a bias voltage supplied to the bases of the amplifying transistors $Q_1$ through $Q_N$. The detection operation will be described below.

When a collector current increases in the detection transistor $Q_S$, the capacitor $C_B$ short-circuits low-frequency components of the collector current, increasing a direct current flowing through the resistor $R_{B2}$. This current increase then decreases a base voltage to the transistor $Q_{B1}$, decreases a current flowing through the resistor $R_{B1}$, and decreases a voltage at the first terminal $T_{B1}$ of the circuit B. A base voltage to the transistor $Q_{B2}$ decreases to decrease a current flowing through the resistor $R_{B3}$. This increases a collector voltage of the transistor $Q_{B2}$ and consequently increases bias voltages to the bases of the amplifying transistors $Q_1$ through $Q_N$. Values of the resistors $R_{B1}$ and $R_{B2}$ in the bias circuit and a parameter for the bipolar transistor $Q_{B1}$ are configured so that the increase amount of the bias voltage almost equals the voltage drop amount in the bias resistors $R_{11}$ through $R_{1N}$.

Effects of the thirteenth embodiment are basically the same as those of the third embodiment.

Embodiment 14

Figure 16:
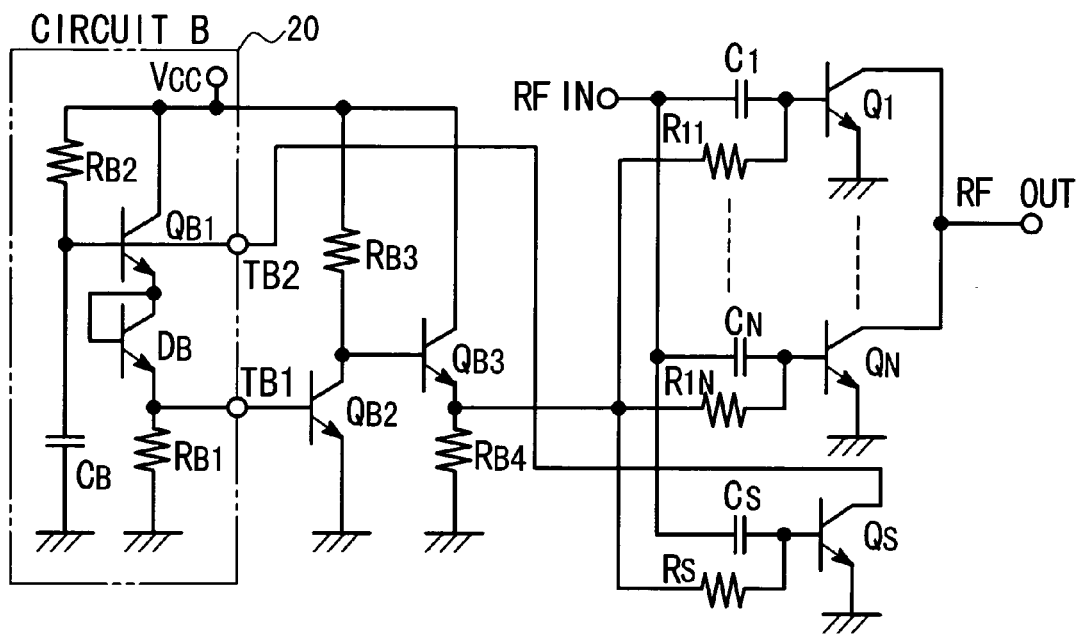
FIG. 16 is a circuit diagram showing a major part of a radio frequency power amplifier according to the fourteenth embodiment of the present invention.

FIG. 16 is a circuit diagram showing a major part of a WCDMA compliant radio frequency power amplifier according to the fourteenth embodiment of the present invention. The diagram includes an amplifying transistor and a bias circuit connected to its base.

The fourteenth embodiment differs from the thirteenth embodiment in FIG. 15 in that there are added the transistor $Q_{B3}$ as SiGe HBT and the resistor $R_{B4}$ as parts of the bias circuit. The other operations in the configuration are the same as those for the thirteenth embodiment. The base of the transistor $Q_{B3}$ is connected to the collector of the transistor $Q_{B2}$. The collector is connected to the constant voltage supply $V_{CC}$. The emitter is grounded via the resistor $R_{B4}$ and is connected to the bases of the amplifying transistors $Q_1$ through $Q_N$ via the bias resistors $R_{11}$ through $R_{1N}$.

The circuit according to the embodiment is configured in this manner and uses the transistor $Q_S$ to detect an average output current proportional amount from the amplifying transistors $Q_1$ through $Q_N$. The detection operation is used to automatically change a bias voltage supplied to the bases of the amplifying transistors $Q_1$ through $Q_N$. The detection operation will be described below.

When a collector current increases in the detection transistor $Q_S$, a voltage drops at the first terminal $T_{B1}$ of the circuit B like the thirteenth embodiment. This voltage drop further decreases a base voltage to the transistor $Q_{B2}$ to decrease a current flowing through the resistor $R_{B3}$. This increases a collector voltage of the transistor $Q_{B2}$. This voltage increase further increases base and emitter voltages for the transistor $Q_{B3}$ and consequently increases bias voltages to the amplifying transistors $Q_1$ through $Q_N$. Values of the resistors $R_{B1}$ and $R_{B2}$ in the bias circuit and a parameter for the bipolar transistor $Q_{B1}$ are configured so that the increase amount of the bias voltage almost equals the voltage drop amount in the bias resistors $R_{11}$ through $R_{1N}$.

Effects of the fourteenth embodiment are basically the same as those of the thirteenth embodiment. Moreover, the fourteenth embodiment adds the emitter follower circuit comprising the transistor $Q_{B3}$ and the resistor $R_{B4}$. Even if a bias voltage fluctuates due to variations of an average base current for the amplifying transistors $Q_1$ through $Q_N$ at low frequencies, it is possible to reduce such fluctuation compared to the thirteenth embodiment. As a result, there is provided an advantage of further decreasing amplification distortion.

Embodiment 15

Figure 17:
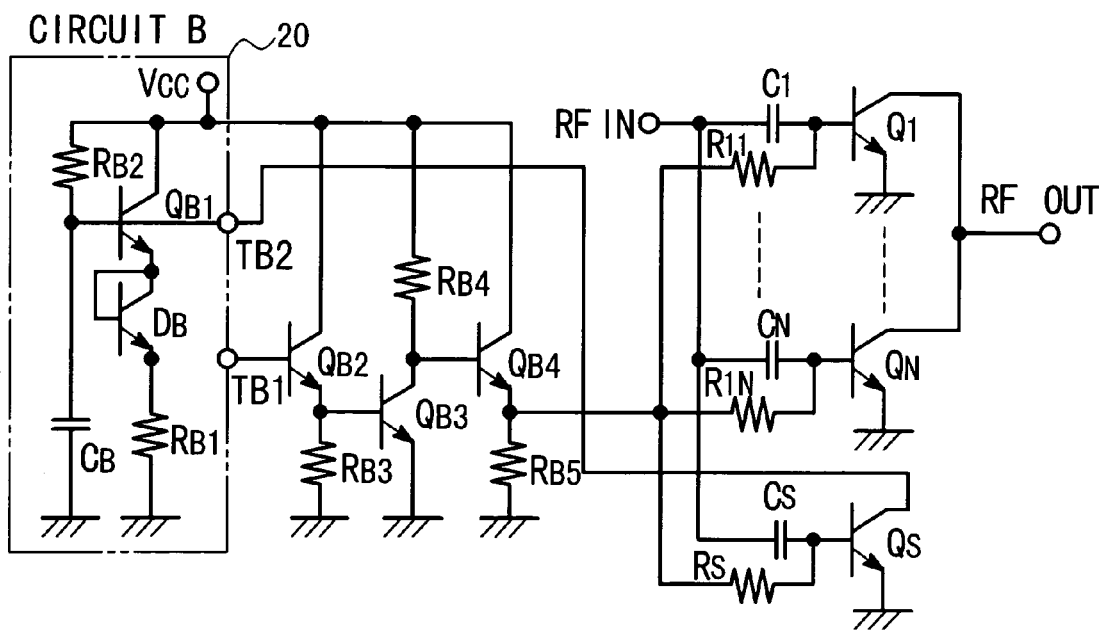
FIG. 17 is a circuit diagram showing a major part of a radio frequency power amplifier according to the fifteenth embodiment of the present invention.
Figure 18:
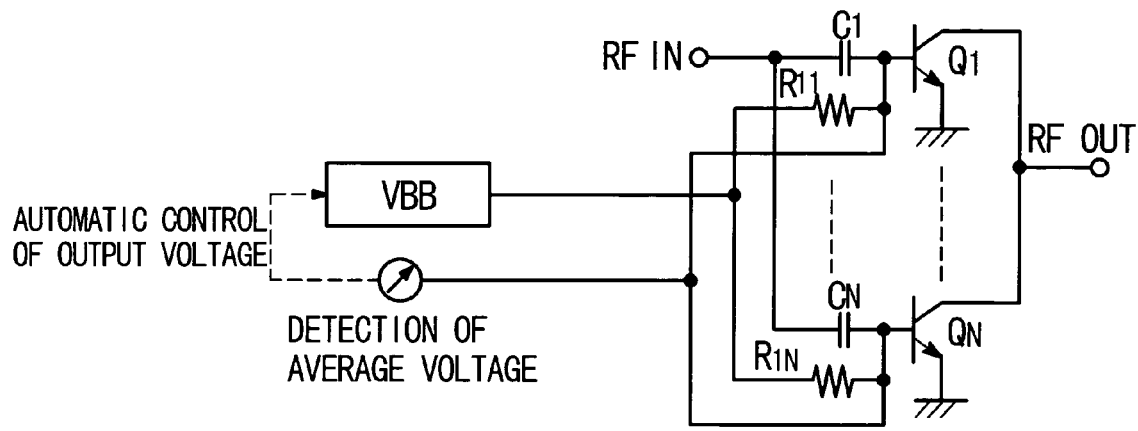
FIG. 18 is a circuit diagram showing a major part representing the common basic concept of the radio frequency power amplifier according to the third to eighth embodiments of the present invention.
Figure 19:
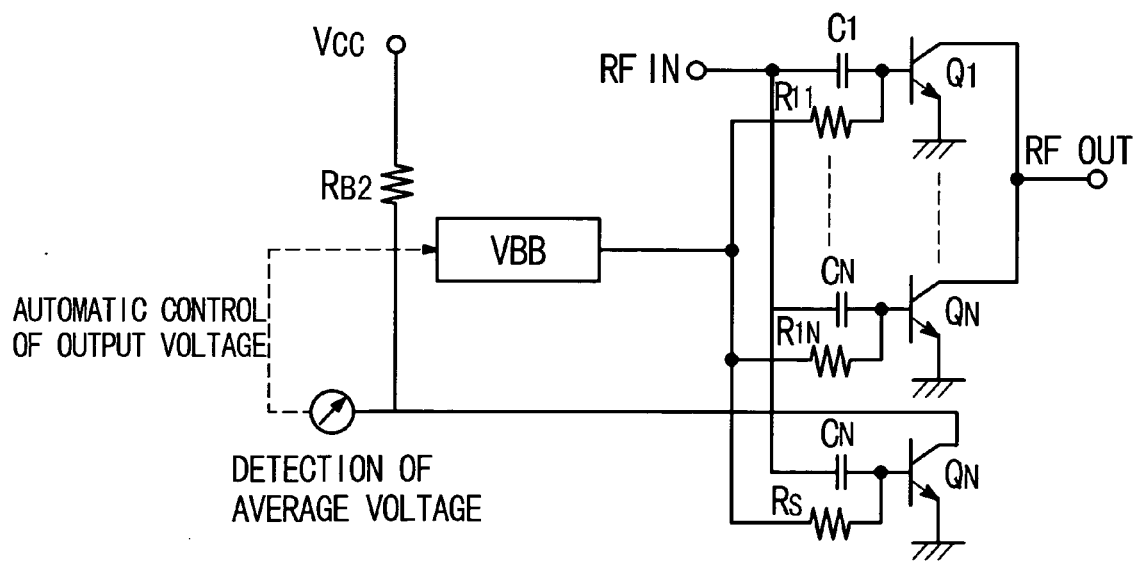
FIG. 19 is a circuit diagram showing a major part representing the common basic concept of the radio frequency power amplifier according to the ninth to fifteenth embodiments of the present invention.

FIG. 17 is a circuit diagram showing a major part of a WCDMA compliant radio frequency power amplifier according to the fifteenth embodiment of the present invention. The diagram includes an amplifying transistor and a bias circuit connected to its base.

The fifteenth embodiment differs from the third embodiment shown in FIG. 15 as follows. The fifteenth embodiment newly adds $Q_{B3}$ and $Q_{B4}$, i.e., SiGe HBTs, and the resistors $R_{B4}$ and $R_{B5}$ as parts of the bias circuit.

The base of the transistor $Q_{B2}$ is connected to the first terminal $T_{B1}$ of the circuit B. The collector is connected to the constant voltage supply $V_{CC}$. The emitter is grounded via the resistor $R_{B3}$ and is connected to the base of the transistor $Q_{B3}$. The emitter of the transistor $Q_{B3}$ is grounded. The collector is connected to the constant voltage supply $V_{CC}$ via the resistor $R_{B4}$ and is connected to the base of the transistor $Q_{B4}$. The collector of the transistor $Q_{B4}$ is connected to the constant voltage supply $V_{CC}$. The emitter is grounded via the resistor $R_{B5}$ and is connected to the bases of the amplifying transistors $Q_1$ through $Q_N$ via the bias resistors $R_{11}$ through $R_{1N}$.

The circuit according to the embodiment is configured in this manner and uses the transistor $Q_S$ to detect an average output current proportional amount from the amplifying transistors $Q_1$ through $Q_N$. The detection operation is used to automatically change a bias voltage supplied to the bases of the amplifying transistors $Q_1$ through $Q_N$. The detection operation will be described below.

When a collector current increases in the detection transistor $Q_S$, a voltage drops at the first terminal $T_{B1}$ of the circuit B like the thirteenth embodiment. This further decreases base and emitter voltages to the transistor $Q_{B2}$. This voltage drop further decreases a base voltage to the transistor $Q_{B3}$ to decrease a current flowing through the resistor $R_{B4}$. This current decrease then increases voltages to the base and the emitter of the transistor $Q_{B4}$. As a result, there occurs an increase in bias voltages supplied to the bases of the amplifying transistors $Q_1$ through $Q_N$. Values of the resistors $R_{B1}$ and $R_{B2}$ in the circuit A and a parameter for the bipolar transistor $Q_{B1}$ are configured so that the increase amount of the bias voltage almost equals the voltage drop amount in the bias resistors $R_{11}$ through $R_{1N}$.

Effects of the twelfth embodiment are basically the same as those of the fourteenth embodiment.

Embodiment 16

Figure 20:
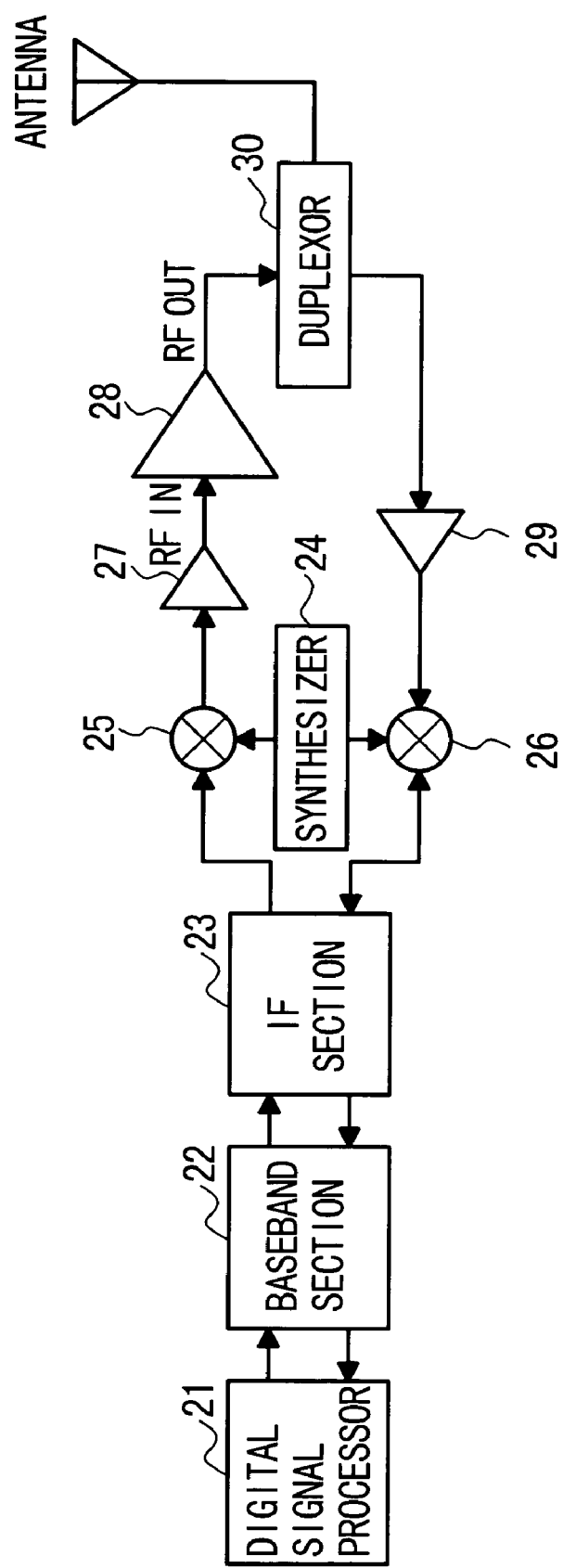
FIG. 20 is a block diagram showing a configuration of a communication system using the radio frequency power amplifier according to any of the first to fifteenth embodiment of the present invention.

FIG. 20 is a block diagram showing a configuration of a communication system using the radio frequency power amplifier according to any of the first to fifteenth embodiment of the present invention. The communication system comprises: a digital signal processor 21; a baseband section 22; an intermediate frequency (IF) section 23; a synthesizer 24; an up-conversion mixer 25; a down-conversion mixer 26; a driver 27; a power amplifier 28; a low noise amplifier 29; a duplexor 30; and an antenna 31.

The power amplifier 27 uses the radio frequency power amplifier according to any of the first to fifteenth embodiments. The power amplifier 27 increases a distortion if an attempt is made to increase the efficiency by adjusting bias conditions. Under the same bias condition and the same efficiency, a small distortion enables higher efficiency below a specified distortion through adjustment of the bias condition. Accordingly, the power amplifier with small distortion according to the present invention can provide higher efficiency than a conventional power amplifier. As a result, the communication system using the power amplifier according to the present invention can reduce the power consumption and elongate an interval for charging batteries.

Figure 21:
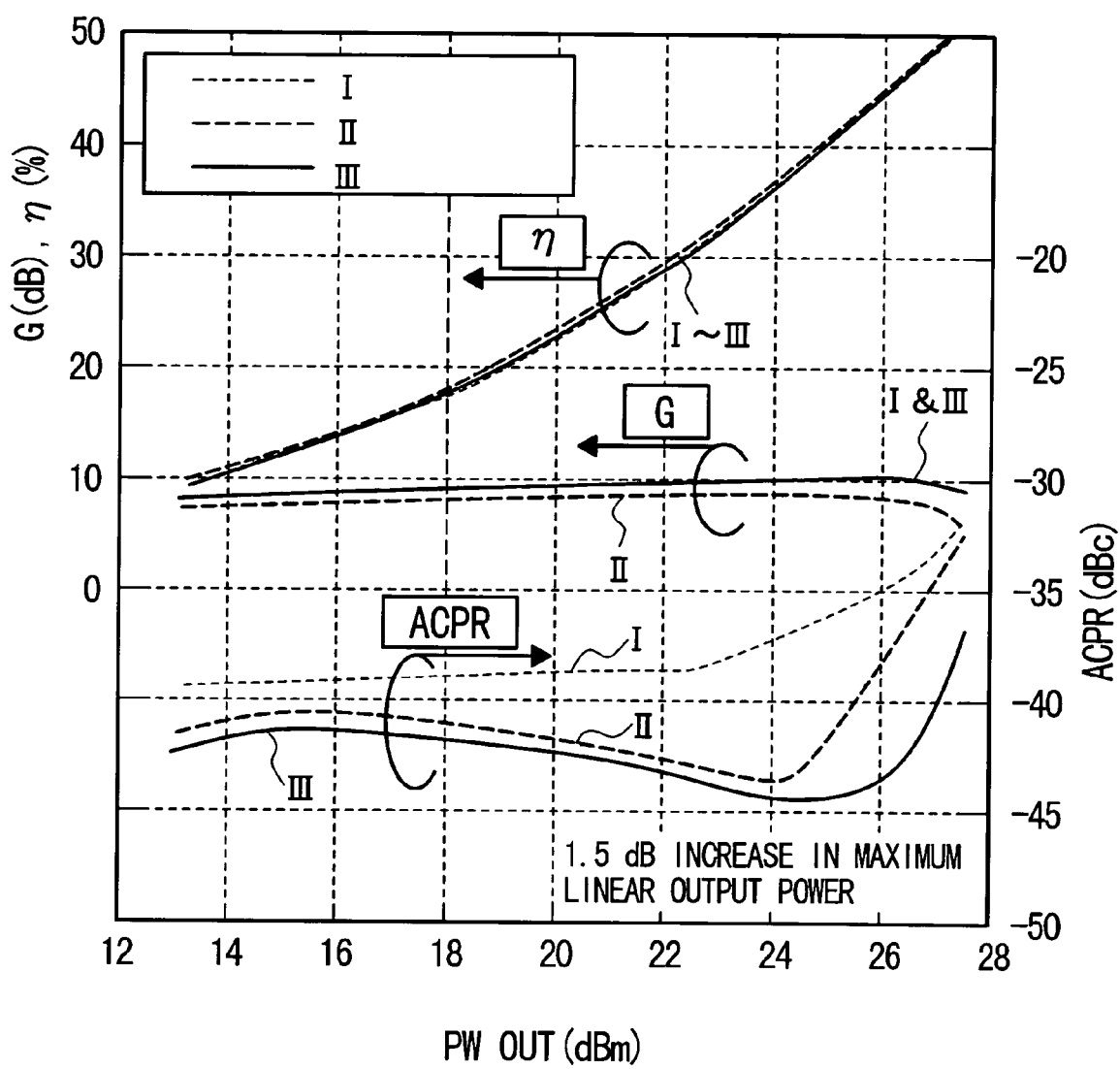
FIG. 21 is a characteristic diagram showing the dependence of gain, efficiency, and adjacent channel power rejection on outputs in order to illustrate effects of the present invention.

With reference to FIG. 21, the following describes effects of the present invention on the performance of the power amplifier compliant with a WCDMA system (1.95 GHz frequency) that has basically the same configuration as the above-mentioned communication system. FIG. 21 shows comparison of the dependence of the power amplifier on adjacent channel leakage power ratio (ACPR), gain G, and output power $PW_{out}$ (dBm) with efficiency η in the cases of using: I. a power amplifier having the same configuration as a prior art without bias resistor; II. a power amplifier incorporating a bias resistor instead of the conventional ballast resistor; and III. the power amplifier according to the present invention that uses a bias resistor and arranges a coil parallel to it for compensating a voltage drop.

The use of the bias resistor and the parallel coil is equivalent to the radio frequency power amplifier according to the first embodiment as shown in FIG. 1. The amplifying transistor uses SiGe HBT. The ACPR shows a ratio between the power leaking to the adjacent channel and the actual signal power when a plurality of 5 MHz detuned signals is amplified. The ACPR works as an index of the amplification distortion. The smaller an ACPR value becomes, the smaller the amplification distortion becomes.

FIG. 21 shows that case (II) of using the bias resistor greatly decreases the ACPR up to approximately 7 dB in comparison with case (I) of using no bias resistor.

Gain G decreases 1 to 2 dB when the bias resistor is used as in case (II). The more an output becomes, the more the gain decreases. This prevents the maximum linear output power from being supplied sufficiently.

In case (III) where the coil is arranged parallel to the bias resistor to compensate a voltage drop due to the bias resistor, gain G becomes almost the same as in case (I) of using no bias resistor. As a result, the maximum linear output power defined as ACPR <−40 dBc increases approximately 1.5 dB in comparison with case (II) of not compensating for a voltage drop.

On the other hand, efficiency η hardly depends on whether or not to provide the bias resistor and compensation for voltage drop. These countermeasures give no side effects on the efficiency. The use of the radio frequency power amplifier according to the present invention can greatly decrease the CAPRI in a wide output power range by maintaining high efficiency.

It is possible to obtain effects similar to those mentioned above concerning the power amplifier performance also through the use of the radio frequency power amplifier according to the present invention described in the embodiments that use no parallel coil.

While there have been described specific preferred embodiments of the present invention, it is to be distinctly understood that the present invention is not limited thereto but may be otherwise variously embodied within the spirit and scope of the invention. While the embodiments have described effects of the WCDMA compliant power amplifier, it will be obvious to those skilled in the art that similar effects are obtained by applying the radio frequency power amplifier to CDMA and the other technologies As will be seen from the above-mentioned embodiments, the present invention can provide the radio frequency power amplifier and the communication system using the same characterized by using SiGe HBT as an amplifying transistor, a small loss in the emitter resistance in comparison with GaAs HBT, high efficiency, and a small amplification distortion in a wide output range.

What is claimed is:

1. A radio frequency power amplifier, comprising:
    a bipolar transistor for emitter ground amplification having a base coupled to an input terminal and a base bias power supply and having a collector coupled to an output terminal, wherein a fixed resistor having a predetermined fixed resistance, and a coil are inserted parallel between the base and the base bias power supply, and
    the coil is connected to the base so that a direct current can be conducted through a section between the coil and the base.

2. The radio frequency power amplifier according to claim 1, wherein a bias resistor is inserted between the base and the base bias power supply, and there is provided a function of detecting an average voltage at a base-side node of the bias resistor and changing output voltage from the base bias power supply in accordance with a detected value.

3. The radio frequency power amplifier according to claim 2, wherein the base bias power supply comprises a first bipolar transistor, first and second resistors, and a first capacitor, and wherein the first bipolar transistor is configured to ground an emitter, ground a base via the first capacitor, connect a collector to a constant voltage supply via the first resistor, and connect the base to the collector via the second resistor.

4. The radio frequency power amplifier according to claim 3, wherein the first bipolar transistor is configured to connect the base to a base of the amplifying bipolar transistor via the first capacitor and a resistor constituting a low-pass filter and connect the collector to the base of the amplifying bipolar transistor via the bias resistor.

5. The radio frequency power amplifier according to claim 4, wherein there are excluded the resistor constituting the low-pass filter and the first capacitor, and the base of the first bipolar transistor is connected to the base of the amplifying bipolar transistor via a coil.

6. The radio frequency power amplifier according to claim 1, wherein the bipolar transistor is an SiGe hetero-junction bipolar transistor in which the base comprises SiGe mix crystal, and the emitter and the collector comprise Si, and wherein the bipolar transistor is configured to ground an emitter, connect a base to an input terminal and a base bias power supply, and connect a collector to an output terminal; a bias resistor is inserted between the base and the base bias power supply; and there is provided a function of detecting an average value of base current or collector current and correspondingly changing an output voltage from the base bias power supply.

* * * * *